US012696587B2

(12) United States Patent (10) Patent No.: US 12,696,587 B2
Sakamoto (45) Date of Patent: Jul. 28, 2026

(54) DISPLAY DEVICE AND METHOD OF FABRICATING THE SAME

(71) Applicant: Samsung Display Co., LTD., Yongin-si (KR)

(72) Inventor: Yoshiaki Sakamoto, Hwaseong-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 924 days.

(21) Appl. No.: 17/959,456

(22) Filed: Oct. 4, 2022

(65) Prior Publication Data

US 2023/0268463 A1 Aug. 24, 2023

(30) Foreign Application Priority Data

Feb. 21, 2022 (KR) ........................ 10-2022-0022257

(51) Int. Cl.
*H10H 20/831* (2025.01)
*H10H 20/01* (2025.01)
*H10H 20/857* (2025.01)
*H10H 29/14* (2025.01)

(52) U.S. Cl.
CPC ........ *H10H 20/8312* (2025.01); *H10H 20/01* (2025.01); *H10H 20/857* (2025.01); *H10H 29/142* (2025.01); *H10H 20/032* (2025.01); *H10H 20/0364* (2025.01)

(58) Field of Classification Search
CPC .. H10H 20/8312; H10H 20/01; H10H 20/857; H10H 20/0364; H10H 20/032; H10H 29/142

USPC .......................................................... 257/79
See application file for complete search history.

(56) References Cited

U.S. PATENT DOCUMENTS

| | | | | |
|---|---|---|---|---|
| 2021/0167253 | A1* | 6/2021 | Basrur | ............... H10H 20/8316 |
| 2021/0335833 | A1* | 10/2021 | Huang | ................... H10F 39/811 |
| 2022/0044976 | A1* | 2/2022 | Ko | ........................ H10H 20/857 |

FOREIGN PATENT DOCUMENTS

| | | |
|---|---|---|
| JP | 2000-162783 | 6/2000 |
| JP | 5409707 | 2/2014 |
| JP | 5422628 | 2/2014 |
| JP | 5492822 | 5/2014 |
| KR | 10-2020-0013190 | 2/2020 |
| KR | 10-2021-0132255 | 11/2021 |

* cited by examiner

*Primary Examiner* — Igwe U Anya
(74) *Attorney, Agent, or Firm* — Womble Bond Dickinson (US) LLP

(57) ABSTRACT

A display device comprises a first electrode and a second electrode disposed to be spaced apart from each other on a substrate, a light emitting element disposed between the first electrode and the second electrode, including a first end and a second end, an insulating layer disposed on the light emitting element, including a fixing portion disposed on at least a portion of the light emitting element and a partition portion surrounding the light emitting element, a first connection electrode electrically contacting the first end of the light emitting element, and a second connection electrode electrically contacting the second end of the light emitting element. A width of an upper surface of each of the fixing portion and the partition portion is greater than a width of a lower surface of each of the fixing portion and the partition portion.

20 Claims, 21 Drawing Sheets

RME: RME1, RME2
CNE: CNE1, CNE2
INS2: INS2_1, INS2_2
CNP: CNP1, CNP2

10

NDA

PX PX PX
PX PX PX
PX PX PX

DPA

DR2

DR1

DR3

DR3

RME: RME1, RME2
CNE: CNE1, CNE2
INS2: INS2_1, INS2_2
CNP: CNP1, CNP2

RME: RME1, RME2
CNE: CNE1, CNE2

RME: RME1, RME2
CNE: CNE1, CNE2
INS2: INS2_3, INS2_4
CNP: CNP1, CNP2

RME: RME1, RME2
CNE: CNE1, CNE2
INS2: INS2_3, INS2_4
CNP: CNP1, CNP2

DR3

RME: RME1, RME2

RME: RME1, RME2

DR3

RME: RME1, RME2

DR3

RME: RME1, RME2
INS2: INS2_1, INS2_2

DR3

RME: RME1, RME2
CNE: CNE1, CNE2
INS2: INS2_1, INS2_2
CNP: CNP1, CNP2

RME': RME1', RME2'
CNE': CNE1', CNE2'
CNP': CNP1', CNP2'

DR3

RME': RME1', RME2'
CNE': CNE1', CNE2'
INS2': INS2_1', INS2_2'
CNP': CNP1', CNP2'

RME: RME1, RME2
CNE: CNE1, CNE2

DISPLAY DEVICE AND METHOD OF FABRICATING THE SAME

CROSS-REFERENCE TO RELATED APPLICATION(S)

This application claims priority to and benefits of Korean Patent Application No. 10-2022-0022257 under 35 U.S.C. 119, filed on Feb. 21, 2022 in the Korean Intellectual Property Office, the entire contents of which are herein incorporated by reference.

BACKGROUND

1. Technical Field

The disclosure relates to a display device and a method of fabricating the same.

2. Description of the Related Art

With the advancement of the information age, the demand for display devices for displaying images has increased with various forms. A display device may be a flat panel display device such as a liquid crystal display device, a field emission display device or a light emitting display panel. The light emitting display device may include an organic light emitting display device including an organic light emitting diode element as a light emitting element, an inorganic light emitting display device including an inorganic semiconductor element as a light emitting element or a micro light emitting diode device including a micro light emitting diode as a light emitting element.

SUMMARY

An aspect of the disclosure is to provide a display device and a method of fabricating the same, in which a process of separating a connection electrode connected to a light emitting element may be simplified.

Aspects of the disclosure are not limited to those mentioned above and additional aspects of the disclosure, which are not mentioned herein, will be clearly understood by those skilled in the art from the following description of the disclosure.

According to an embodiment of the disclosure, a display device may include a first electrode and a second electrode disposed to be spaced apart from each other on a substrate, a light emitting element disposed between the first electrode and the second electrode, including a first end and a second end, an insulating layer disposed on the light emitting element, including a fixing portion disposed on at least a portion of the light emitting element and a partition portion surrounding the light emitting element, a first connection electrode electrically contacting the first end of the light emitting element, and a second connection electrode electrically contacting the second end of the light emitting element. A width of an upper surface of each of the fixing portion and the partition portion may be greater than a width of a lower surface of each of the fixing portion and the partition portion.

In an embodiment, each of the fixing portion and the partition portion may have an inverse taper shape in which a width from the upper surface to the lower surface may be reduced.

In an embodiment, the first connection electrode and the second connection electrode may be spaced apart from each other with the fixing portion interposed therebetween.

In an embodiment, the display device may further include a conductive pattern disposed on the fixing portion to overlap the light emitting element, wherein the conductive pattern may be spaced apart from the first connection electrode and the second connection electrode.

In an embodiment, the conductive pattern and the first connection electrode and the second connection electrode may include a same material.

In an embodiment, the insulating layer may include an organic insulating material.

In an embodiment, the display device may further include a first insulating layer disposed between the first and second electrodes and the light emitting element, and first and second contact portions exposing upper surfaces of the first and second electrodes by passing through the first insulating layer. The first electrode and the first connection electrode may be electrically connected to each other through the first contact portion, and the second electrode and the second connection electrode may be electrically connected to each other through the second contact portion.

In an embodiment, a thickness of the first insulating layer may be smaller than that of the insulating layer.

In an embodiment, the insulating layer may include a first opening exposing the first end of the light emitting element, and a second opening exposing the second end of the light emitting element, and the first connection electrode may be disposed in the first opening, and the second connection electrode may be disposed in the second opening.

In an embodiment, the fixing portion and the partition portion may be integral with each other, and the fixing portion may be disposed across the partition portion.

In an embodiment, the fixing portion and the partition portion may be physically separated from each other, and an inner diameter of the partition portion may be greater than an outer diameter of the fixing portion.

According to an embodiment of the disclosure, a display device may include a first electrode and a second electrode disposed to be spaced apart from each other in a subpixel, light emitting elements disposed between the first electrode and the second electrode, each including a first end and a second end, an insulating layer disposed on the light emitting elements, including a fixing portion disposed on at least a portion of the light emitting elements, a partition portion surrounding the subpixel, and openings disposed between the fixing portion and the partition portion, a first connection electrode electrically contacting the first end of the light emitting elements, and a second connection electrode electrically contacting the second end of the light emitting elements. The first connection electrode and the second connection electrode may be disposed in the openings.

In an embodiment, the fixing portion may be extended in a second direction intersecting a first direction that may be a longitudinal direction of the light emitting element, and the partition portion may be extended in the first direction and the second direction.

In an embodiment, the display device may further comprise a bank layer extended in a first direction and a second direction intersecting the first direction, surrounding the subpixel, wherein the insulating layer may be disposed on the bank layer.

In an embodiment, a width of the partition portion in the first direction may be greater than a width of the bank layer in the first direction.

In an embodiment, the opening may expose the first end and the second end of the light emitting element.

In an embodiment, the subpixel may include a first subpixel and a second subpixel adjacent to a direction of the first subpixel, a second connection electrode of the first subpixel and a third connection electrode of the second subpixel may be disposed to be spaced apart from each other with the partition portion interposed therebetween.

According to an embodiment of the disclosure, a method of fabricating a display device may include aligning a light emitting element between a first electrode and a second electrode, which may be spaced apart from each other, on a substrate, forming a first opening exposing a first end of the light emitting element and a second opening exposing a second end of the light emitting element by etching an insulating material layer formed on the light emitting element, and forming a first connection electrode, which electrically contacts the first end of the light emitting element, in the first opening and forming a second connection electrode, which electrically contacts the second end of the light emitting element, in the second opening. The etching of the insulating material layer may include forming a fixing portion on at least a portion of the light emitting element and a partition portion surrounding the light emitting element, and each of the fixing portion and the partition portion may have a width of an upper surface, which may be greater than a width of a lower surface.

In an embodiment, the forming of the first connection electrode and the second connection electrode may further include forming a conductive pattern, which may be spaced apart from the first connection electrode and the second connection electrode, on the fixing portion and the partition portion.

In an embodiment, the first connection electrode, the second connection electrode, and the conductive pattern may be simultaneously formed.

In the display device and the method of fabricating the same according to the embodiments of the disclosure, an insulating layer on a light emitting element may include a fixing portion and a partition portion. Since the fixing portion and the partition portion may separate connection electrodes even without patterning a connection conductive layer, a fabricating process may be simplified.

The effects according to the embodiments of the disclosure are not limited to those mentioned above and more various effects are included in the following description of the disclosure.

BRIEF DESCRIPTION OF THE DRAWINGS

The above and other aspects and features of the disclosure will become more apparent by describing in detail embodiments thereof with reference to the attached drawings, in which.

DETAILED DESCRIPTION OF THE EMBODIMENTS

Figure 1:
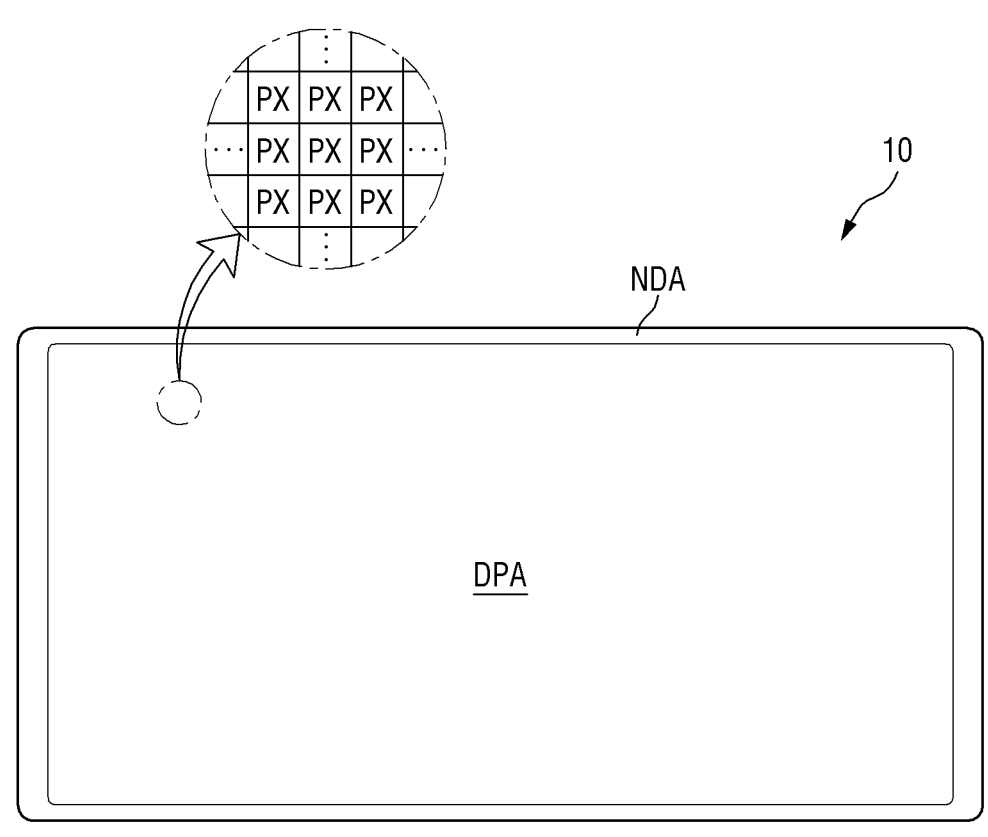
FIG. 1 is a schematic plan view illustrating a display device according to an embodiment of the disclosure.
Figure 1:
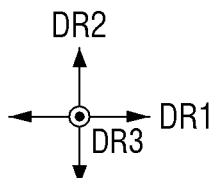

The disclosure will now be described more fully hereinafter with reference to the accompanying drawings, in which embodiments are shown. This disclosure may, however, be embodied in different forms and should not be construed as limited to the embodiments set forth herein. Rather, these embodiments are provided so that this disclosure will be thorough and complete, and will fully convey the scope of the disclosure to those skilled in the art.

As used herein, the singular forms, "a," "an," and "the" are intended to include the plural forms as well, unless the context clearly indicates otherwise.

It will also be understood that when a layer is referred to as being "on" another layer or substrate, it can be directly on the other layer or substrate, or intervening layers may also be present. The same reference numbers indicate the same components throughout the specification.

It will be understood that, although the terms "first," "second," etc. may be used herein to describe various elements, these elements should not be limited by these terms. These terms are only used to distinguish one element from another element. For instance, a first element discussed below could be termed a second element without departing from the teachings of the disclosure. Similarly, the second element could also be termed the first element.

Each of the features of the various embodiments of the disclosure may be combined or combined with each other, in part or in whole, and technically various interlocking and driving are possible. Each embodiment may be implemented independently of each other or may be implemented together in an association.

The terms "overlap" or "overlapped" mean that a first object may be above or below or to a side of a second object, and vice versa. Additionally, the term "overlap" may include layer, stack, face or facing, extending over, covering, or partly covering or any other suitable term as would be appreciated and understood by those of ordinary skill in the art.

When an element is described as "not overlapping" or to "not overlap" another element, this may include that the elements are spaced apart from each other, offset from each other, or set aside from each other or any other suitable term as would be appreciated and understood by those of ordinary skill in the art.

In the specification and the claims, the term "and/or" is intended to include any combination of the terms "and" and "or" for the purpose of its meaning and interpretation. For example, "A and/or B" may be understood to mean any combination of "A, B, or A and B." The terms "and" and "or" may be used in the conjunctive or disjunctive sense and may be understood to be equivalent to "and/or." In the specification and the claims, the phrase "at least one of" is intended to include the meaning of "at least one selected from the group of" for the purpose of its meaning and interpretation. For example, "at least one of A and B" may be understood to mean any combination of "A, B, or A and B."

It will be understood that the terms "connected to" or "coupled to" may include a physical or electrical connection or coupling Unless otherwise defined, all terms (including technical and scientific terms) used herein have the same meaning as commonly understood by one of ordinary skill in the art to which the disclosure pertains. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

FIG. 1 is a schematic plan view illustrating a display device according to an embodiment of the disclosure.

Referring to FIG. 1, a display device 10 displays a moving image or a still image. The display device 10 may refer to all electronic devices that provide a display screen. For example, a television, a laptop computer, a monitor, an advertising board, Internet of Things device, a mobile phone, a smart phone, a tablet personal computer (PC), an electronic watch, a smart watch, a watch phone, a head mounted display, a mobile communication terminal, an electronic diary, an electronic book, a portable multimedia player (PMP), a navigator, a game machine, a digital camera, a camcorder and the like, which provide a display screen, may be included as the display device 10.

The display device 10 may include a display panel for providing a display screen. Examples of the display panel may include an inorganic light emitting diode display panel, an organic light emitting display panel, a quantum dot light emitting display panel, a plasma display panel, and a field emission display panel. Hereinafter, an inorganic light emitting diode display panel is applied as an example of a display panel, but the example of the display panel is not limited thereto. Other display panels may be used.

Various modifications may be made in a shape of the display device 10. For example, the display device 10 may have a rectangular shape that may be long in a horizontal direction, a rectangular shape that may be long in a vertical direction, a square shape, a rectangular shape with rounded corners (vertexes), other polygonal shape, a circular shape, etc. A shape of a display area DPA of the display device 10 may also be similar to the overall shape of the display device 10. The display device 10 that may be longer in a first direction DR1 is illustrated in FIG. 1.

The display device 10 may include a display area DPA and a non-display area NDA. The display area DPA may be an area in which a screen may be displayed, and the non-display area NDA may be an area in which a screen may not be displayed. The display area DPA may be referred to as an active area, and the non-display area NDA may be referred to as a non-active area. The display area DPA may generally occupy the center of the display device 10.

The display area DPA may include pixels PX. The pixels PX may be arranged (disposed) in a matrix direction. A shape of each pixel PX may be a rectangular or square shape on a plane, but is not limited thereto. The shape of each pixel PX may be a rhombus shape in which each side is inclined with respect to a direction. The respective pixels PX may be alternately arranged in a stripe type or a PenTile® type. Each of the pixels PX may include one or more light emitting elements for emitting light of a specific wavelength band to display a specific color.

The non-display area NDA may be disposed in the vicinity of the display area DPA. The non-display area NDA may fully or partially surround the display area DPA. The display area DPA may be rectangular in shape, and the non-display area NDA may be disposed to be adjacent to four sides of the display area DPA. The non-display area NDA may constitute a bezel of the display device 10. Lines or circuit drivers included in the display device 10 may be disposed in the non-display areas NDA, or external devices may be packaged therein.

Figure 2:
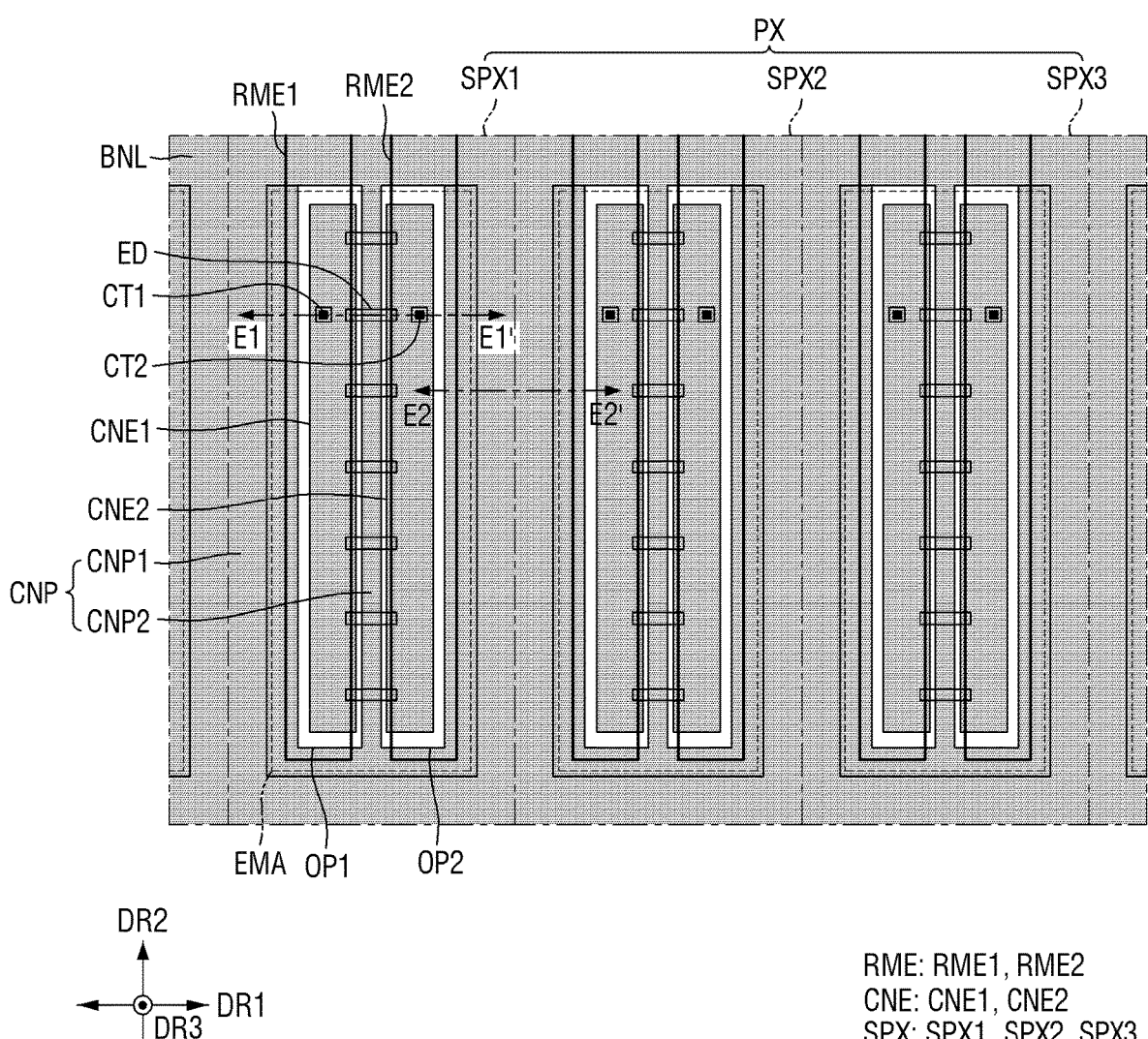
FIG. 2 is a schematic plan view illustrating a pixel of a display device according to an embodiment of the disclosure.
Figure 3:
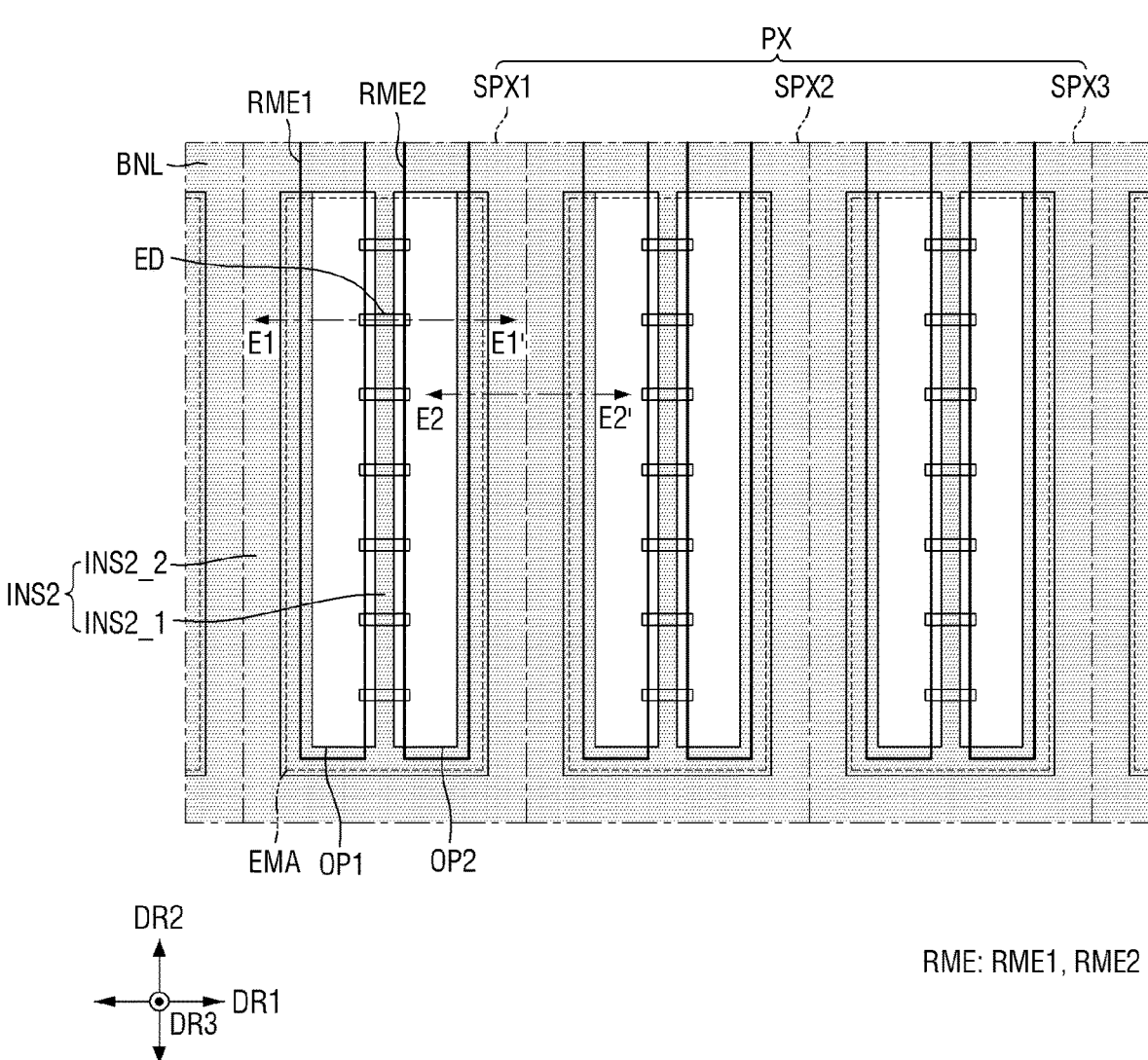
FIG. 3 is a schematic plan view illustrating arrangement of electrodes, light emitting elements, a bank layer and a second insulating layer, which may be disposed in a pixel of FIG. 2.

FIG. 2 is a schematic plan view illustrating a pixel of a display device according to an embodiment of the disclosure. FIG. 3 is a schematic plan view illustrating arrangement of electrodes, light emitting elements, a bank layer and a second insulating layer, which may be disposed in a pixel of FIG. 2.

FIG. 2 illustrates a planar arrangement of electrodes RME: RME1 and RME2, a bank layer BNL, light emitting elements ED, connection electrode CNE: CNE1 and CNE2, and conductive patterns CNP: CNP1 and CNP2, which may be disposed in a pixel PX of the display device 10. FIG. 3 illustrates a planar arrangement of electrodes RME, a bank layer BNL, light emitting elements ED, and second insulating layers INS2: INS2_1 and INS2_2.

Referring to FIGS. 2 and 3, each of the pixels PX of the display device 10 may include subpixels SPXn. For example, a pixel PX may include a first subpixel SPX1, a second subpixel SPX2 and a third subpixel SPX3. The first subpixel SPX1 may emit light of a first color, the second subpixel SPX2 may emit light of a second color, and the third subpixel SPX3 may emit light of a third color. For example, the first color may be blue, the second color may be green and the third color may be red, but the disclosure is not limited thereto. The respective subpixels SPXn may emit light of the same color. In an embodiment, the respective subpixels SPXn may emit blue. Although one pixel PX is illustrated as including three subpixels SPXn, it is not limited thereto, and the pixel PX may include a larger number of subpixels.

Each subpixel SPXn of the display device 10 may include a light emission area EMA and a non-light emission area. The light emission area EMA may be an area in which a light emitting element ED may be disposed to emit light of a specific wavelength band. The non-light emission area may be an area in which the light emitting element ED may not be disposed and light emitted from the light emitting element ED may not reach there so that the light may not be emitted.

The light emission area EMA may include an area in which the light emitting element ED may be disposed, and an area in which the light emitted from the light emitting element ED may be emitted to an area adjacent to the light emitting element ED. For example, the light emission area EMA may also include an area where the light emitted from the light emitting element ED may be reflected or refracted by another member. The light emitting elements ED may be disposed in the respective subpixels SPXn, and may include an area in which the subpixels may be disposed and an area adjacent to the above area to form the light emission area.

The light emission areas EMA of the respective subpixels SPXn are illustrated as having a uniform size, but are not limited thereto. In some embodiments, each light emission area EMA of each subpixel SPXn may have a size different from that of another light emission area depending on the color or wavelength band of the light emitted from the light emitting element ED disposed in the corresponding subpixel SPXn.

Referring to FIG. 3, the display device 10 may include electrodes RME: RME1 and RME2, bank patterns ('BP1' and 'BP2' of FIG. 4), a bank layer BNL, light emitting elements ED, and second insulating layers INS2: INS2_1 and INS2_2. Referring to FIG. 2, the display device 10 may further include connection electrodes CNE: CNE1 and CNE2 disposed on the second insulating layer INS2, and conductive patterns CNP: CNP1 and CNP2.

The bank layer BNL may be disposed at a boundary between the respective subpixels SPXn, and the bank patterns BP1 and BP2 may be disposed in the light emission area EMA of each subpixel SPXn. Although bank patterns BP1 and BP2 are not shown in FIGS. 2 and 3, a first bank pattern BP1 and a second bank pattern BP2 may be disposed below the first and second electrodes RME1 and RME2, respectively. The first bank pattern BP1 and the second bank pattern BP2 may have a shape extended in a second direction DR2, which may be an extension direction of the electrodes RME1 and RME2.

The electrodes RME: RME1 and RME2 may be disposed in each subpixel SPXn in a shape extended in a direction. The electrodes RME1 and RME2 may be extended in the second direction DR2 to be disposed in the light emission area EMA of the subpixel SPXn, and may be spaced apart from each other in the first direction DR1. The electrodes RME may be electrically connected to the light emitting element ED, which will be described later, but are not limited thereto, and the electrodes RME may not be electrically connected to the light emitting element ED.

The display device 10 may include a first electrode RME1 and a second electrode RME2, which may be disposed in each subpixel SPXn. The first electrode RME1 may be disposed on a left side at the center of the light emission area EMA, and the second electrode RME2 may be spaced apart from the first electrode RME1 in the first direction DR1 and disposed on a right side at the center of the light emission area EMA. The first electrode RME1 and the second electrode RME2 may be partially disposed in the corresponding subpixel SPXn beyond the bank layer BNL. The first and second electrodes RME1 and RME2 of different subpixels SPXn may be spaced apart from each other based on the bank layer BNL or a partition portion INS2_2 of the second insulating layer INS2.

The two electrodes RME are illustrated as being extended in the second direction DR2 for each subpixel SPXn, but are not limited thereto.

The bank layer BNL may be disposed to surround multiple subpixels SPXn and light emission areas EMA. The bank layer BNL may be disposed at a boundary between adjacent subpixels SPXn in the first direction DR1 and the second direction DR2. The subpixels SPXn and the light emission area EMA of the display device 10 may be areas partitioned by the arrangement of the bank layer BNL. An interval between the subpixels SPXn and the emission areas EMA may vary depending on a width of the bank layer BNL.

The bank layer BNL may include a portion extended in the first direction DR1 and the second direction DR2 on a plane, and may be disposed in a lattice-shaped pattern on a front surface of the display area DPA. The bank layer BNL may be disposed over a boundary of the respective subpixels SPXn to partition adjacent subpixels SPXn. The bank layer BNL may be disposed to surround the light emission area EMA disposed for each subpixel SPXn, thereby partitioning the light emission areas EMA.

The light emitting elements ED may be disposed in the light emission area EMA. The light emitting elements ED may be disposed between the electrodes RME1 and RME2, and may be spaced apart from each other in the second direction DR2. In an embodiment, the light emitting elements ED may have a shape extended in the first direction DR1 that may be a longitudinal direction, and their ends may be disposed on the different electrodes RME1 and RME2. The light emitting element ED may be longer than an interval between the electrodes RME spaced apart from each other in the first direction DR1. The light emitting elements ED may be generally extended to be perpendicular to the second direction DR2 in which the electrodes RME may be extended, but are not limited thereto, and the light emitting element ED may be extended toward the first direction DR1 or in a direction inclined with respect to the first direction DR1.

The second insulating layers INS2: INS2_1 and INS2_2 may be disposed to surround the subpixels SPXn. The second insulating layer INS2 may be disposed at a boundary between the subpixels SPXn adjacent to each other in the first direction DR1 and the second direction DR2. The subpixels SPXn of the display device 10 may be areas partitioned by the arrangement of the second insulating layer INS2. The second insulating layer INS2 may be disposed on the front surface of the display area DPA including a portion extended in the first direction DR1 and the second direction DR2 on a plane, but is not limited thereto.

The second insulating layer INS2 may include a fixing portion INS2_1 and a partition portion INS2_2, which may be disposed in each of the subpixels SPXn. The fixing portion INS2_1 may have a shape extended in the second direction DR2 between the electrodes RME1 and RME2, and may be disposed on at least a portion of the light emitting element ED. The fixing portion INS2_1 may form a linear pattern in each of the subpixels SPXn, but is not limited thereto, and the fixing portion INS2_1 may form an island-shaped pattern in each of the subpixels SPXn.

The partition portion INS2_2 may have a shape extended in the first direction DR1 and the second direction DR2, and may be disposed to surround the light emitting elements ED. The partition portion INS2_2 may be disposed at a boundary of the respective subpixels SPXn to partition the subpixels SPXn. The partition portion INS2_2 may overlap at least a portion of the electrodes RME1 and RME2. A width of the partition portion INS2_2 in the first direction DR1 may be greater than that of the bank layer BNL in the first direction DR1.

The second insulating layer INS2 may include openings OP1 and OP2 that expose both sides or both ends of the light emitting elements ED. The openings OP1 and OP2 may be disposed between the fixing portion INS2_1 and the partition portion INS2_2, and may be surrounded by the fixing portion INS2_1 and the partition portion INS2_2. The openings OP1 and OP2 may have a shape extended in the second direction DR2, and may be spaced apart from each other for each subpixels SPXn in the first direction DR1. The first opening OP1 may expose a first end of a light emitting element ED, and may overlap the first electrode RME1. The second opening OP2 may expose a second end of a light emitting element ED, and may overlap the second electrode RME2.

The connection electrodes CNE: CNE1 and CNE2 may be disposed on the electrodes RME and the second insulating layer INS2. The connection electrodes CNE may have a shape extended in a direction, respectively, and may be spaced apart from each other. Each of the connection electrodes CNE may be in contact with the light emitting element ED, and may be electrically connected to the electrode RME or a conductive layer below the electrode RME. The connection electrodes CNE may be disposed in the openings OP1 and OP2 of the second insulating layer INS2. The connection electrodes CNE may be disposed between the fixing portion INS2_1 and the partition portion INS2_2 of the second insulating layer INS2.

The connection electrodes CNE may include the first connection electrode CNE1 and the second connection electrode CNE2, which may be disposed in each subpixel SPXn. The first connection electrode CNE1 may have a shape extended in the second direction DR2, and may be disposed on the first electrode RME1 or the first bank pattern BP1. The first connection electrode CNE1 may be disposed in the light emission area EMA while partially overlapping the first electrode RME1. The first connection electrode CNE1 may be disposed in the first opening OP1 of the second insulating layer INS2. The second connection electrode CNE2 may have a shape extended in the second direction DR2, and may be disposed on the second electrode RME2 or the second bank pattern BP2. The second connection electrode CNE2 may partially overlap the second electrode RME2 and may be disposed in a light emission area EMA. The second connection electrode CNE2 may be disposed in the second opening OP2 of the second insulating layer INS2.

The connection electrodes CNE1 and CNE2 disposed in each of the subpixels SPXn may be spaced apart from each other by the fixing portion INS2_1 of the second insulating layer INS2. For example, the first connection electrode CNE1 disposed in the first subpixel SPX1 may be spaced apart from the second connection electrode CNE2 with the fixing portion INS2_1 interposed therebetween. The fixing portion INS2_1 may separate the first connection electrode CNE1 and the second connection electrode CNE2, which may be disposed in one subpixel SPXn, from each other.

The connection electrodes CNE1 and CNE2 disposed for each adjacent subpixel SPXn may be spaced apart from each other by the partition portion INS2_2 of the second insulating layer INS2. For example, the second connection electrode CNE2 of the first subpixel SPX1 may be spaced apart from the first connection electrode CNE1 of the second subpixel SPX2 adjacent thereto with the partition portion INS2_2 interposed therebetween. The partition portion INS2_2 may separate the first connection electrode CNE1 and the second connection electrode CNE2, which may be disposed in the subpixels SPXn adjacent to each other, from each other. When the connection electrodes of the first subpixel SPX1 are referred to as the first connection electrode CNE1 and the second connection electrode CNE2, the connection electrodes of the second subpixel SPX2 may be referred to as a third connection electrode and a fourth connection electrode.

The conductive patterns CNP: CNP1 and CNP2 may be disposed on the electrodes RME and the second insulating layer INS2. Since the conductive patterns CNP may be disposed on an upper surface of the second insulating layer INS2, they may have the same shape as that of the second insulating layer INS2. For example, the conductive patterns CNP may be disposed on the front surface of the display area DPA by including portions extended in the first direction DR1 and the second direction DR2 on the plane, but are not limited thereto.

The conductive patterns CNP may include a first conductive pattern CNP1 disposed on the fixing portion INS2_1 and a second conductive pattern CNP2 disposed on the partition portion INS2_2. The first conductive pattern CNP1 may have a shape extended in the second direction DR2 between the electrodes RME1 and RME2, and may be disposed to overlap at least a portion of the light emitting element ED. The first conductive pattern CNP1 may be disposed between the first connection electrode CNE1 and the second connection electrode CNE2, and may be spaced apart from the first and second connection electrodes. The second conductive pattern CNP2 may have a shape extended in the first direction DR1 and the second direction DR2, and may be disposed to surround the light emitting elements ED. The second conductive pattern CNP2 may overlap at least a portion of the electrodes RME1 and RME2. The second conductive pattern CNP2 may be disposed at a boundary of the subpixels SPXn.

Figure 4:
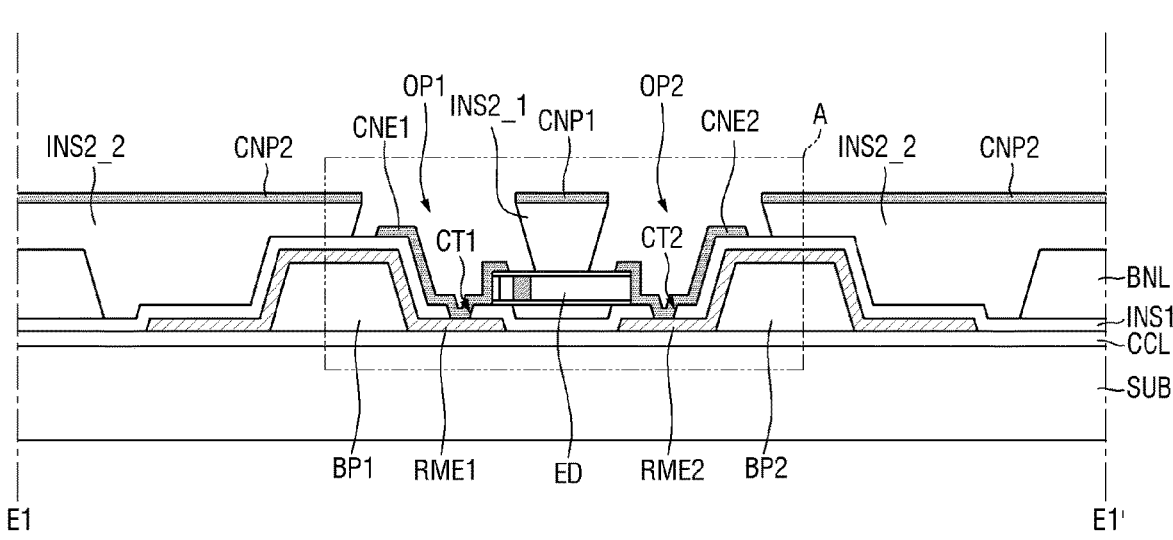
FIG. 4 is a schematic cross-sectional view taken along line E1-E1' of FIGS. 2 and 3.
Figure 5:
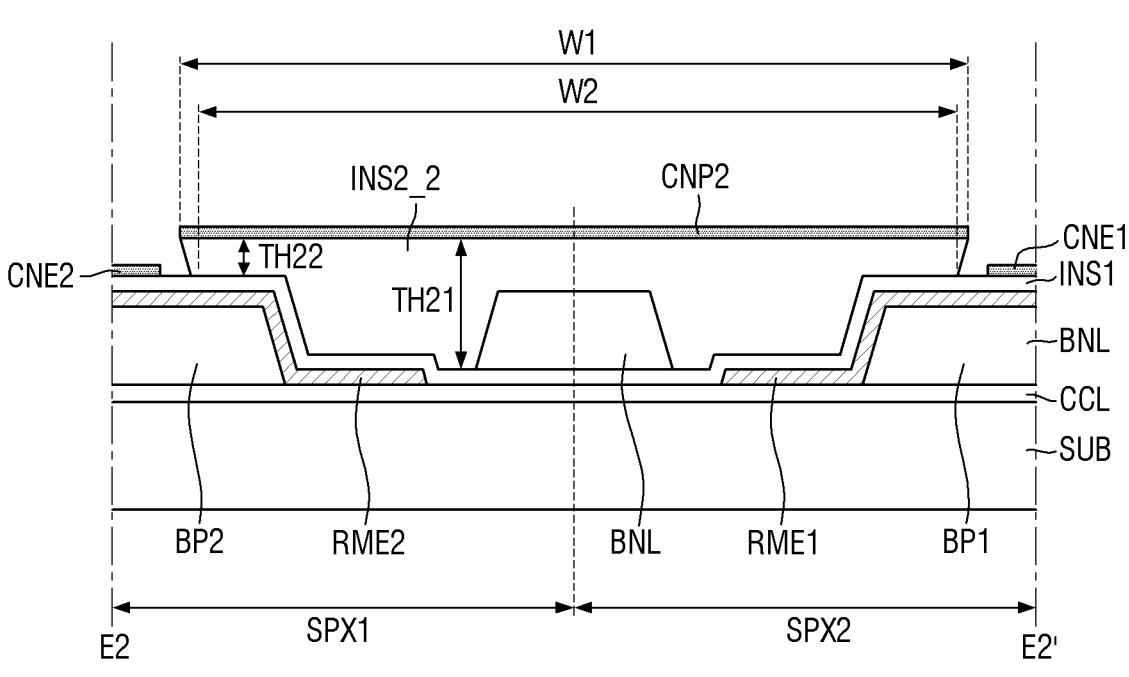
FIG. 5 is a schematic cross-sectional view taken along line E2-E2' of FIGS. 2 and 3.
Figure 5:

FIG. 4 is a schematic cross-sectional view taken along line E1-E1' of FIGS. 2 and 3. FIG. 5 is a schematic cross-sectional view taken along line E2-E2' of FIGS. 2 and 3. FIG. 4 shows a cross-section across both ends of the light emitting element ED disposed in the first subpixel SPX1 and contact portions CT1 and CT2, and FIG. 5 shows a schematic cross-section across the partition portion INS2_2 disposed in the first subpixel SPX1 and the second subpixel SPX2.

Referring to FIGS. 2 to 5, the display device 10 may include a substrate SUB, a circuit element layer CCL disposed on the substrate SUB, and a light emitting element layer disposed on the circuit element layer CCL. The light emitting element layer may include bank patterns BP1 and BP2, electrodes RME: RME1 and RME2, a bank layer BNL, a light emitting element ED, connection electrodes CNE: CNE1 and CNE2, conductive patterns CNP: CNP1 and CNP2, and insulating layers. The insulating layers may include a first insulating layer INS1 and a second insulating layer INS2. Although not shown, the circuit element layer CCL may include a semiconductor layer, a conductive layer, and insulating layers.

The substrate SUB may be an insulating substrate. The substrate SUB may be made of an insulating material such as glass, quartz, and/or a polymer resin. The substrate SUB may be a rigid substrate, but may be a flexible substrate capable of being subjected to bending, folding, rolling, or the like. The substrate SUB may include a display area DPA and a non-display area NDA surrounding the display area DPA, and the display area DPA may include a light emission area EMA.

The circuit element layer CCL may include voltage lines electrically connected to the electrodes RME1 and RME2 or the connection electrodes CNE1 and CNE2 to apply a power voltage. The first voltage line may be electrically connected to the first electrode RME1 or the first connection electrode CNE1 to apply a first power voltage, and the second voltage line may be electrically connected to the second electrode RME2 or the second connection electrode CNE2 to apply a second power voltage. For example, the first power voltage may be a high potential voltage, and the second power voltage may be a low potential voltage.

The bank patterns BP1 and BP2 may be disposed on the circuit element layer CCL. For example, the bank patterns BP1 and BP2 may have a structure in which at least a portion thereof may be protruded based on an upper surface of the circuit element layer CCL. The protruded portions of the bank patterns BP1 and BP2 may have sides inclined or bent with a curvature, and light emitted from the light emitting element ED may be reflected by the electrode RME disposed on the bank patterns BP1 and BP2 to be emitted in an upper direction of the substrate SUB. The bank patterns BP1 and BP2 may include, but are not limited to, an organic insulating material such as polyimide PI.

The electrodes RME: RME1 and RME2 may be disposed on the bank patterns BP1 and BP2 and the circuit element layer CCL. For example, the first electrode RME1 and the second electrode RME2 may be disposed on the inclined sides of at least the bank patterns BP1 and BP2. At least a portion of the first electrode RME1 and the second electrode RME2 may be disposed directly on the circuit element layer CCL, whereby the first electrode RME1 and the second electrode RME2 may be disposed on the same plane.

The light emitting element ED disposed between the bank patterns BP1 and BP2 may emit light in a direction of both ends, and the emitted light may be directed to the electrode RME disposed on the bank patterns BP1 and BP2. Each electrode RME may have a structure in which a portion disposed on the bank patterns BP1 and BP2 may reflect the light emitted from the light emitting element ED. The first electrode RME1 and the second electrode RME2 may be disposed to cover at least one side of at least the bank patterns BP1 and BP2, thereby reflecting the light emitted from the light emitting element ED.

The respective electrodes RME may be electrically connected to the light emitting elements ED to apply an electrical signal to the light emitting element ED to emit light. For example, the first electrode RME1 and the second electrode RME2 may be electrically connected to the light emitting elements ED through the connection electrodes CNE1 and CNE2 that will be described later. The electrical signal applied from the first voltage line and the second voltage line of the circuit element layer CCL to the electrodes RME1 and RME2 may be transferred to the light emitting element ED through the connection electrodes CNE1 and CNE2.

The electrodes RME may include a conductive material having high reflectance. For example, the electrodes RME may include at least one of a metal, such as silver (Ag), copper (Cu) and aluminum (Al), or an alloy including aluminum (Al), nickel (Ni), lanthanum (La), etc., or may have a structure in which a metal layer such as titanium (Ti), molybdenum (Mo), and niobium (Nb) and the alloy may be stacked on each other. In some embodiments, the electrodes RME may be comprised of a double layer or multiple layers in which an alloy including aluminum (Al) and at least one metal layer including titanium (Ti), molybdenum (Mo), and niobium (Nb) may be stacked on each other.

Without limitation to the above example, each electrode RME may further include a transparent conductive material. For example, each electrode RME may include a material such as ITO, IZO and ITZO. In some embodiments, each of the electrodes RME may form a structure in which a transparent conductive material and a metal layer having high reflectance may be stacked to form one or more layers, or may be formed of a single layer that includes the transparent conductive material and the metal layer. For example, each electrode RME may have a stacked structure such as ITO/Ag/ITO, ITO/Ag/IZO, or ITO/Ag/ITZO/IZO. The electrodes RME may be electrically connected to the light emitting element ED, and may reflect a portion of the light emitted from the light emitting element ED in the upper direction of the substrate SUB.

The first insulating layer INS1 may be disposed on the front surface of the display area DPA, and may be disposed on the circuit element layer CCL and the electrodes RME. The first insulating layer INS1 may include an insulating material to protect the electrodes RME and at the same time insulate the different electrodes RME from each other. The first insulating layer INS1 may be disposed to cover the electrodes RME before the bank layer BNL may be formed, thereby preventing the electrodes RME from being damaged in the process of forming the bank layer BNL. Also, the first insulating layer INS1 may prevent the light emitting element ED disposed on the first insulating layer INS1 from being damaged due to direct contact with other members.

In an embodiment, the first insulating layer INS1 may be stepped such that a portion of the upper surface may be recessed between the electrodes RME spaced apart from each other in the first direction DR1. The light emitting element ED may be disposed on the upper surface on which the first insulating layer INS1 may be stepped, and a space may be formed between the light emitting element ED and the first insulating layer INS1.

The first insulating layer INS1 may include contact portions CT1 and CT2. The contact portions CT1 and CT2 may be disposed to overlap their respective electrodes RME different from each other. For example, the contact portions CT1 and CT2 may include a first contact portion CT1 disposed to overlap the first electrode RME1, and a second contact portion CT2 disposed to overlap the second electrode RME2. The first and second contact portions CT1 and CT2 may pass through the first insulating layer INS1 to expose a portion of an upper surface of the first electrode RME1 or the second electrode RME2 below the first insulating layer INS1. The electrode RME exposed by each of the contact portions CT1 and CT2 may be in contact with the connection electrode CNE. The first contact portion CT1 and the second contact portion CT2 are illustrated as being disposed between the bank patterns BP1 and BP2, but are not limited thereto. For example, the contact portions CT1 and CT2 may be disposed in the non-light emission area not the light emission area EMA, or may be disposed at both ends of the light emitting element ED.

The first insulating layer INS1 may include an inorganic insulating material or an organic insulating material. In an embodiment, in case that the first insulating layer INS1 includes an inorganic insulating material, the first insulating layer INS1 may be at least one of silicon oxide ($SiO_x$), silicon nitride ($SiN_x$), and silicon oxynitride ($SiO_xN_y$).

The bank layer BNL may be disposed on the first insulating layer INS1. The bank layer BNL may include a portion extended in the first direction DR1 and the second direction DR2, and may surround each of the subpixels SPXn. The bank layer BNL may surround the light emission area EMA of each subpixel SPXn to partition the light emission areas EMA, and may surround the outmost portion of the display area DPA to partition the display area DPA from the non-display area NDA.

The bank layer BNL may have a height similar to the bank patterns BP1 and BP2. In some embodiments, a height of an upper surface of the bank layer BNL may be higher than that of each of the bank patterns BP1 and BP2, and a thickness thereof may be equal to or greater than that of each of the bank patterns BP1 and BP2. The bank layer BNL may prevent ink from overflowing to the subpixel SPXn adjacent thereto in an inkjet printing process during a fabricating process of the display device 10. The bank layer BNL may include an organic insulating material such as a polyimide in the same manner as the bank patterns BP1 and BP2.

The light emitting elements ED may be disposed on the first insulating layer INS1 between the bank patterns BP1 and BP2. A light emitting element ED may be disposed such that one extended direction may be parallel with an upper surface of the substrate SUB. As described below, the light emitting element ED may include semiconductor layers disposed along the extended direction, and the semiconductor layers may be sequentially disposed along a direction parallel with the upper surface of the substrate SUB.

The light emitting elements ED disposed in the respective subpixels SPXn may emit light having different wavelength bands depending on the material of the semiconductor layer, but are not limited thereto, and the light emitting elements ED disposed in the respective subpixels SPXn may include semiconductor layers of the same material to emit light of the same color.

The light emitting elements ED may be electrically connected to the electrode RME and the circuit element layer CCL in contact with the connection electrodes CNE, and may emit light of a specific wavelength band as an electrical signal may be applied thereto.

The second insulating layers INS2: INS2_1 and INS2_2 may be disposed on the light emitting elements ED, the first insulating layer INS1 and the bank layer BNL. The second insulating layers INS2 may be disposed along the first direction DR1 and the second direction DR2 in the emission area EMA of each subpixel SPXn.

The second insulating layer INS2 may include a fixing portion INS2_1 disposed on the light emitting element ED in each subpixel SPXn and a partition portion INS2_2 disposed to surround the light emitting elements ED.

The fixing portion INS2_1 may be disposed on at least a portion of the light emitting element ED between the electrodes RME1 and RME2 and the bank patterns BP1 and BP2. The fixing portion INS2_1 may be extended in the same direction as the extension direction of the electrodes RME1 and RME2 and the extension direction of the connection electrodes CNE1 and CNE2, and may be extended in the second direction DR2 crossing (intersecting) the first direction DR1 that may be the extension direction of the light emitting element ED. The fixing portion INS2_1 may be disposed to partially surround an outer surface of the light emitting element ED, and may expose both sides or both ends of the light emitting element ED without covering them. The fixing portion INS2_1 may protect the light emitting element ED and at the same time fix the light emitting elements ED during the fabricating process of the display device 10. The fixing portion INS2_1 may be disposed to fill a space between the light emitting element ED and the first insulating layer INS1 below the light emitting element ED.

The partition portion INS2_2 may be disposed on the electrodes RME1 and RME2, the bank patterns BP1 and BP2 and the bank layer BNL to surround the light emitting elements ED. The partition portion INS2_2 may be extended in the first direction DR1 and the second direction DR2. The partition portion INS2_2 may not overlap the light emitting element ED in the third direction DR3. The partition portion INS2_2 may be disposed to surround the light emitting element ED so that the light emitting element ED may be completely exposed. The partition portion INS2_2 may be disposed on at least a portion of the bank patterns BP1 and BP2 and the electrodes RME1 and RME2, and may overlap these bank patterns and electrodes in the third direction DR3. The partition portion INS2_2 may be disposed to completely cover an upper surface and a side of the bank layer BNL. A width of the partition portion INS2_2 may be greater than that of the bank layer. For example, widths W1 and W2 of the partition portion INS2_2 may be greater than that of the bank layer BNL.

The fixing portion INS2_1 may be integrally formed with the partition portion INS2_2. In other words, the fixing portion INS2_1 may be formed simultaneously with the partition portion INS2_2, and may include the same material as that of the partition portion INS2_2. The fixing portion INS2_1 may be physically connected to the partition portion INS2_2. The fixing portion INS2_1 may be formed to cross the partition portion INS2_2.

The second insulating layer INS2 may include openings OP1 and OP2 that expose both ends of the light emitting element ED. The openings OP1 and OP2 may partially overlap the electrodes RME1 and RME2 to expose first and second ends of the light emitting element ED. The openings OP1 and OP2 may be disposed between the fixing portion INS2_1 and the partition portion INS2_2, and may be surrounded by the fixing portion INS2_1 and the partition portion INS2_2. The openings OP1 and OP2 may be extended in the second direction DR2 that may be the same as the extension direction of the fixing portion INS2_1.

The openings OP1 and OP2 may include a first opening OP1 exposing the first end of the light emitting element ED and a second opening OP2 exposing the second end of the light emitting element ED. The openings OP1 and OP2 may partially overlap the light emitting element ED.

The first opening OP1 may overlap the first bank pattern BP1 and the first electrode RME1. The second opening OP2 may overlap the second bank pattern BP2 and the second electrode RME2. Although one first opening OP1 and one second opening OP2 are illustrated as being disposed in each light emission area EMA, the disclosure is not limited thereto. The first and second openings OP1 and OP2 may have the same width or may have their respective widths different from each other.

In an embodiment of the disclosure, each of the fixing portion INS2_1 and the partition portion INS2_2 of the second insulating layer INS2 may include an upper surface, a lower surface, and sides. Each of the fixing portion INS2_1 and the partition portion INS2_2 may have an inverse taper shape (or reverse trapezoidal shape) in which a width may be reduced toward the lower surface from the upper surface. For example, a width ('W3' of FIG. 7) of the upper surface of the fixing portion INS2_1 may be greater than a width ('W4' of FIG. 7) of the lower surface, and the sides may have an inclined shape. The sides of the fixing portion INS2_1 may be inclined at an acute angle with respect to the upper surface. The width W1 of the upper surface of the partition portion INS2_2 may be greater than the width W2 of the lower surface thereof, and the sides may have an inclined shape. The sides of the partition portion INS2_2 may be inclined at an acute angle with respect to the upper surface.

In an embodiment, the second insulating layer INS2 may include an organic insulating material. In case that the second insulating layer INS2 includes an organic insulating material, the second insulating layer INS2 may be an acrylic resin, a urethane-based resin, an epoxy-based resin, and/or a polyimide-based resin, but is not limited thereto. In case that the second insulating layer INS2 includes an organic material, the upper surface of each of the fixing portion INS2_1 and the partition portion INS2_2 may be generally flat. For example, a step between the fixing portion INS2_1 and the partition portion INS2_2 may be small, but is not limited thereto. The second insulating layer INS2 may have a step difference along an area where the bank patterns BP1 and BP2 and the bank layer BNL may be present and an area where the bank patterns BP1 and BP2 and the bank layer BNL may not be present (similar to FIG. 8). Therefore, the upper surface of the partition portion INS2_2 may be formed at a position higher than the upper surface of the fixing portion INS2_1 disposed on the light emitting element ED.

The connection electrodes CNE: CNE1 and CNE2 may be disposed on the electrodes RME and the bank patterns BP1 and BP2. The first connection electrode CNE1 may be disposed on the first electrode RME1 and the first bank pattern BP1. The second connection electrode CNE2 may be disposed on the second electrode RME2 and the second bank pattern BP2.

The first connection electrode CNE1 and the second connection electrode CNE2 may be disposed on the first insulating layer INS1, and may be in contact with the light emitting elements ED. The first connection electrode CNE1 may partially overlap the first electrode RME1, and may be in contact with the first end of the light emitting elements ED. The second connection electrode CNE2 may partially overlap the second electrode RME2, and may be in contact with the second end of the light emitting elements ED.

The connection electrodes CNE may be disposed in the openings OP1 and OP2 of the second insulating layer INS2, and may be disposed between the fixing portion INS2_1 and the partition portion INS2_2 of the second insulating layer INS2. The first connection electrode CNE1 may be disposed in the first opening OP1, and may be disposed between the partition portion INS2_2 and the fixing portion INS2_1, which overlap the first bank pattern BP1. The second connection electrode CNE2 may be disposed in the second opening OP2, and may be disposed between the partition portion INS2_2 and the fixing portion INS2_1, which overlap the second bank pattern BP2.

In an embodiment, the connection electrodes CNE in the respective subpixels SPXn may be physically and electrically spaced apart from each other between the light emitting elements ED by the fixing portions INS2_1 of the second insulating layer INS2. The connection electrodes CNE in the adjacent subpixels SPXn may be physically and electrically spaced apart from each other between the subpixels SPXn by the partition portion INS2_2 of the second insulating layer INS2.

The connection electrodes CNE1 and CNE2 may be in contact with the electrodes RME1 and RME2 through the contact portions CT1 and CT2. The first connection electrode CNE1 may be in contact with the first electrode RME1 through the first contact portion CT1 that passes through the first insulating layer INS1. The first electrode RME1 may be electrically connected to the first power line of the circuit element layer CCL. The second connection electrode CNE2 may be in contact with the second electrode RME2 through the second contact portion CT2, and the second electrode RME2 may be electrically connected to the second power line. The first power voltage may be applied to the first connection electrode CNE1, and the second power voltage may be applied to the second connection electrode CNE2. Each connection electrode CNE may be in contact with the light emitting element ED in the light emission area EMA to transfer the power voltage to the light emitting element ED.

The connection electrodes CNE may include a conductive material. For example, the connection electrodes CNE may include ITO, IZO, ITZO, aluminum (Al), etc. For example, the connection electrode CNE may include a transparent conductive material, and the light emitted from the light emitting element ED may be emitted by transmitting the connection electrode CNE.

The conductive patterns CNP: CNP1 and CNP2 may be disposed on the electrodes RME and the second insulating layer INS2. The conductive patterns CNP may be separated from the light emitting element ED and the connection electrodes CNE1 and CNE2 by the second insulating layer INS2. The conductive patterns CNP may be formed simultaneously with the connection electrodes CNE1 and CNE2 in the process of forming the connection electrodes CNE1 and CNE2. The conductive patterns CNP may remain on the second insulating layer INS2 while being physically spaced apart from the connection electrodes CNE1 and CNE2 by the second insulating layer INS2 having an inverse taper shape.

Each shape of the conductive patterns CNP may vary depending on a shape of the upper surface of the second insulating layer INS2. Since the conductive patterns CNP may be disposed on the upper surface of the second insulating layer INS2, the conductive patterns CNP may generally have a flat lower surface and a flat upper surface in case that the upper surface of the second insulating layer INS2 is flat.

The conductive patterns CNP may include a first conductive pattern CNP1 disposed on the fixing portion INS2_1 and a second conductive pattern CNP2 disposed on the partition portion INS2_2.

The first conductive pattern CNP1 may be disposed on the light emitting element ED and the fixing portion INS2_1, and may sequentially overlap them in the third direction DR3. The first conductive pattern CNP1 may be disposed between the first electrode RME1 and the second electrode RME2. The first conductive pattern CNP1 may be disposed on the fixing portion INS2_1 while being physically spaced apart from the connection electrodes CNE1 and CNE2 by the fixing portion INS2_1 having a reverse taper shape. Since the upper surface of the fixing portion INS2_1 may be generally flat, the upper surface of the first conductive pattern CNP1 may be generally flat like the extension direction of the substrate SUB.

The second conductive pattern CNP2 may be disposed on the bank patterns BP1 and BP2, the electrodes RME1 and RME2, the first insulating layer INS1, the bank layer BNL and the partition portion INS2_2. At least a portion of the second conductive pattern CNP2 may sequentially overlap the bank patterns BP1 and BP2, the electrodes RME1 and RME2, the first insulating layer INS1 and the partition portion INS2_2 in the third direction DR3, and another portion of the second conductive pattern CNP2 may sequentially overlap the first insulating layer INS1, the bank layer BNL, and the partition portion INS2_2. The second conductive pattern CNP2 may be disposed over adjacent subpixels SPXn. For example, the second conductive pattern CNP2 may be disposed between the first connection electrode CNE1 of the (n)th subpixel SPXn and the second connection electrode CNE2 of the (n-1)th subpixel SPXn-1. For another example, the second conductive pattern CNP2 may be disposed between the second connection electrode CNE2 of the (n)th subpixel SPXn and the first connection electrode CNE1 of the (n+1)th subpixel SPXn+1. In FIG. 5, the second conductive pattern CNP2 is illustrated as being disposed between the second connection electrode CNE2 of the first subpixel SPX1 and the first connection electrode CNE1 of the second subpixel SPX2.

The second conductive pattern CNP2 may be disposed on the partition portion INS2_2 while being physically spaced apart from the connection electrodes CNE1 and CNE2 by the partition portion INS2_2 having a reverse taper shape. Since the upper surface of the partition portion INS2_2 may be generally flat, the upper surface of the second conductive pattern CNP2 may be generally flat like the extension direction of the substrate SUB.

Since the conductive pattern CNP may be formed simultaneously with the connection electrodes CNE1 and CNE2, the conductive pattern CNP may include the same conductive material as that of the connection electrodes CNE1 and CNE2. The conductive pattern CNP may be formed on the second insulating layer INS2 in a growth process of a conductive layer to form the connection electrodes CNE1 and CNE2, for example, a sputtering type growth process, and may have a thickness substantially equal to or similar to that of the connection electrodes CNE1 and CNE2.

Although not shown, another insulating layer may be further disposed on the connection electrodes CNE1 and CNE2 and the conductive pattern CNP. The insulating layer may serve to protect the members disposed on the substrate SUB against an external environment.

Figure 6:
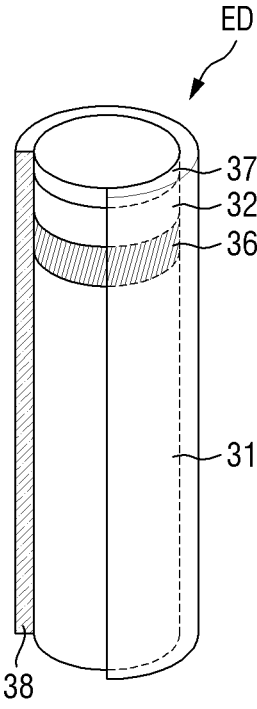
FIG. 6 is a schematic view illustrating a light emitting element according to an embodiment of the disclosure.

FIG. 6 is a schematic view illustrating a light emitting element according to an embodiment of the disclosure.

Referring to FIG. 6, the light emitting element ED may be a light emitting diode, and in detail, the light emitting element ED may be an inorganic light emitting diode having a size of a nano-meter or a micro-meter and made of an inorganic material. The light emitting element ED may be aligned between two electrodes having polarities in case that an electric field is formed in a specific direction between the two electrodes facing each other.

The light emitting element ED according to an embodiment may have a shape extended in a direction. The light emitting element ED may have a cylindrical shape, a rod shape, a wire shape or a tube shape, but is not limited thereto. The light emitting element ED may have a polygonal pillar shape such as a cube, a cuboid, and a hexagonal pillar, or may have various shapes such as a shape extended in a direction, having an external surface that may be partially inclined.

The light emitting element ED may include a semiconductor layer doped with any conductivity type (e.g., p-type or n-type) impurities. The semiconductor layer may emit light of a specific wavelength band as an electrical signal applied from an external power source may be transferred thereto. The light emitting element ED may include a first semiconductor layer 31, a second semiconductor layer 32, a light emitting layer 36, an electrode layer 37 and an insulating layer 38.

The first semiconductor layer 31 may be an n-type semiconductor. The first semiconductor layer 31 may include a semiconductor material having a chemical formula of $Al_xGa_yIn_{1-x-y}N$ ($0 \leq x \leq 1$, $0 \leq y \leq 1$, $0 \leq x+y \leq 1$). For example, the first semiconductor layer 31 may be any one or more of AlGaInN, GaN, AlGaN, InGaN, AlN and InN, which may be doped with n-type dopants. The n-type dopants doped in the first semiconductor layer 31 may be Si, Ge, Sn, etc.

The second semiconductor layer 32 may be disposed on the first semiconductor layer 31 with the light emitting layer 36 interposed therebetween. The second semiconductor layer 32 may be a p-type semiconductor, and may include a semiconductor material having a chemical formula of $Al_xGa_yIn_{1-x-y}N$ ($0 \leq x \leq 1$, $0 \leq y \leq 1$, $0 \leq x+y \leq 1$). For example, the second semiconductor layer 32 may be any one or more of AlGaInN, GaN, AlGaN, InGaN, AlN and InN, which may be doped with p-type dopants. The p-type dopants doped in the second semiconductor layer 32 may be Mg, Zn, Ca, Ba, etc.

The first semiconductor layer 31 and the second semiconductor layer 32 are shown as being formed of a single layer, but are not limited thereto. The first semiconductor layer 31 and the second semiconductor layer 32 may further include a larger number of layers, such as a clad layer or a tensile strain barrier reducing (TSBR) layer, depending on the material of the light emitting layer 36. For example, the light emitting element ED may further include another semiconductor layer disposed between the first semiconductor layer 31 and the light emitting layer 36, or between the second semiconductor layer 32 and the light emitting layer 36. The semiconductor layer disposed between the first semiconductor layer 31 and the light emitting layer 36 may be any one or more of AlGaInN, GaN, AlGaN, InGaN, AlN, InN and SLs doped with n-type dopants. The semiconductor layer disposed between the second semiconductor layer 32 and the light emitting layer 36 may be any one or more of AlGaInN, GaN, AlGaN, InGaN, AlN and InN doped with p-type dopants.

The light emitting layer 36 may be disposed between the first semiconductor layer 31 and the second semiconductor layer 32. The light emitting layer 36 may include a single or multiple quantum well structure material. In case that the light emitting layer 36 includes a material of a multiple quantum well structure, quantum layers and well layers may be alternately stacked on each other. The light emitting layer 36 may emit light by combination of electron-hole pairs in accordance with electrical signals applied through the first semiconductor layer 31 and the second semiconductor layer 32. The light emitting layer 36 may include a material such as AlGaN, AlGaInN and InGaN. Particularly, in case that the light emitting layer 36 has a stacked structure of quantum layers and well layers, which are alternately stacked in a multiple quantum well structure, the quantum layer may include a material such as AlGaN or AlGaInN, and the well layer may include a material such as GaN or AlInN.

The light emitting layer 36 may have a structure in which a semiconductor material having a big band gap energy and semiconductor materials having a small band gap energy may be alternately stacked on each other, and may include group-III or group-V semiconductor materials depending on a wavelength band of light that may be emitted. The light emitting layer 36 may emit light of a red or green wavelength band, as the case may be, without being limited to light of a blue wavelength band.

The electrode layer 37 may be an ohmic connection electrode, but is not limited thereto. The electrode layer 37 may be a Schottky connection electrode. The light emitting element ED may include at least one electrode layer 37. The light emitting element ED may include one or more electrode layers 37, but is not limited thereto. The electrode layer 37 may be omitted.

The electrode layer 37 may reduce resistance between the light emitting element ED and an electrode or a connection electrode in case that the light emitting element ED is electrically connected with the electrode or the connection electrode in the display device 10. The electrode layer 37 may include a metal having conductivity. For example, the electrode layer 37 may include at least one of Al, Ti, In, Au, Ag, ITO, IZO or ITZO.

The insulating layer 38 may be disposed to surround outer surfaces of the semiconductor layers and electrode layers. For example, the insulating layer 38 may be disposed to surround at least an outer surface of the light emitting layer 36, and may be formed to expose both ends in a longitudinal direction of the light emitting element ED. Also, the upper surface of the insulating layer 38 may have a round shape, a semi-circular shape, or a semi-oval shape on a section in an area adjacent to at least one end of the light emitting element ED.

The insulating layer 38 may include materials having an insulation property, for example, at least one of silicon oxide (SiO$_x$), silicon nitride (SiN$_x$), silicon oxynitride (SiO$_x$N$_y$), aluminum nitride (AlN$_x$), aluminum oxide (AlO$_x$), zirconium oxide (ZrO$_x$), hafnium oxide (HfO$_x$), and/or titanium oxide (TiO$_x$). The insulating layer 38 is illustrated as being formed of a single layer, but is not limited thereto. In some embodiments, the insulating layer 38 may be formed of a multi-layered structure in which multiple layers may be stacked on each other.

The insulating layer 38 may serve to protect the semiconductor layers and the electrode layers of the light emitting element ED. The insulating layer 38 may prevent an electrical short that may occur in the light emitting layer 36 in case that the light emitting element ED is directly in contact with the electrode to which the electrical signal may be transferred. The insulating layer 38 may prevent light emitting efficiency of the light emitting element ED from being deteriorated.

Figure 7:
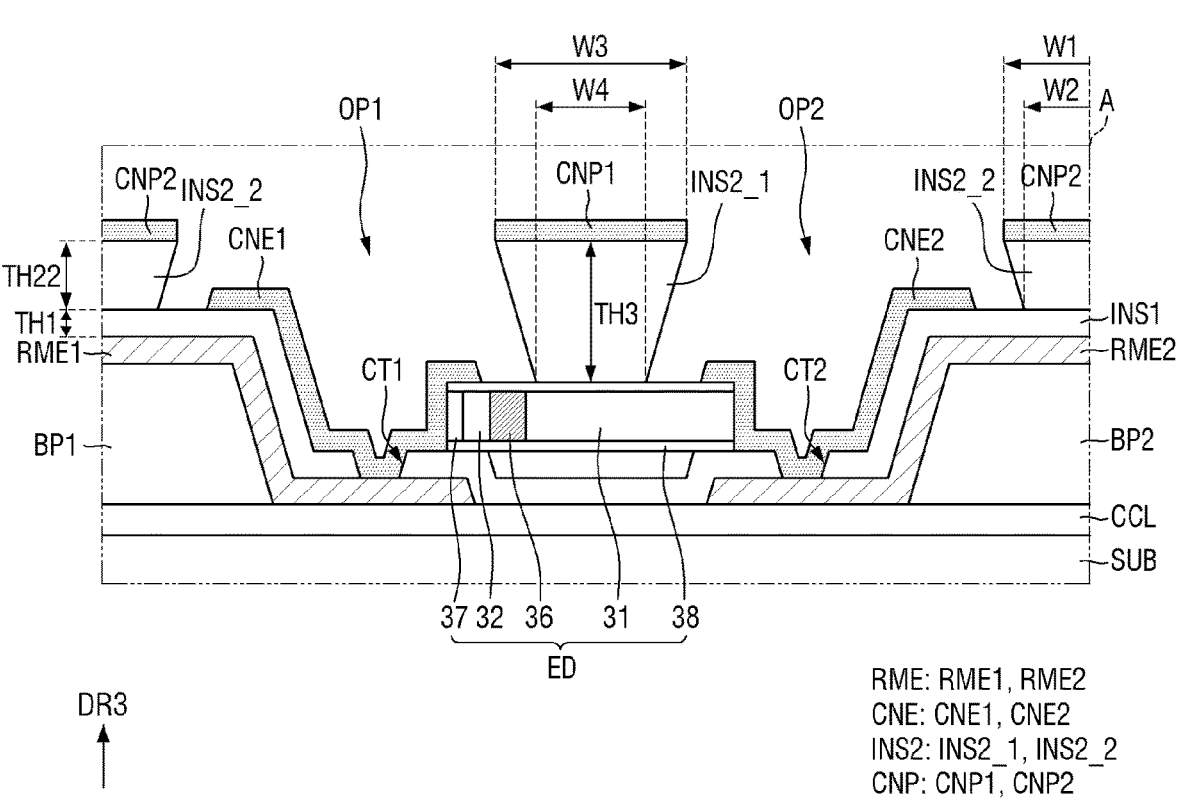
FIG. 7 is an enlarged schematic cross-sectional view illustrating region A of FIG. 4.

FIG. 7 is an enlarged schematic cross-sectional view illustrating region A of FIG. 4. FIG. 7 illustrates that a first end in which the electrode layer 37 of the light emitting element ED may be disposed and a second end in which the first semiconductor layer 31 may be disposed may be extended from the display device 10 in the first direction DR1.

Referring to FIG. 7, the first end of the light emitting element ED may be disposed to be adjacent to the first bank pattern BP1, and the second end may be disposed to be adjacent to the second bank pattern BP2. In the display device 10, the electrode layer 37, the second semiconductor layer 32, the light emitting layer 36 and the first semiconductor layer 31 may be sequentially disposed in the first direction DR1.

The light emitting element ED may be disposed between the first electrode RME1 and the second electrode RME2, and may partially overlap the first electrode RME1 and the second electrode RME2. The first end of the light emitting element ED and a portion of the upper surface adjacent to the first end may be in contact with the first connection electrode CNE1. The second end of the light emitting element ED and a portion of the upper surface adjacent to the second end may be in contact with the second connection electrode CNE2.

The fixing portion INS2_1 of the second insulating layer INS2 may be disposed between the first connection electrode CNE1 and the second connection electrode CNE2. The fixing portion INS2_1 may be disposed to non-overlap the first end and the second end of the light emitting element ED. The width W3 of the upper surface of the fixing portion INS2_1 may be greater than a width W4 of the lower surface thereof. The width of the fixing portion INS2_1 may be reduced toward the lower surface from the upper surface. The fixing portion INS2_1 may serve to separate the first connection electrode CNE1 from the second connection electrode CNE2. In the process of forming a connection conductive layer, which includes connection electrodes CNE1 and CNE2 and conductive patterns CNP1 and CNP2, on the second insulating layer INS2, even though there may be no patterning process of separating the connection electrodes CNE1 and CNE2, the first conductive pattern CNP1 and the connection electrodes CNE may be disconnected by the fixing portion INS2_1. Therefore, the first connection electrode CNE1 and the second connection electrode CNE2 may be separated from each other.

The partition portion INS2_2 of the second insulating layer INS2 may be disposed to surround the first connection electrode CNE1 and the second connection electrode CNE2. The width W1 of the upper surface of the partition portion INS2_2 may be greater than the width W2 of the lower surface thereof. The width of the partition portion INS2_2 may be reduced toward the lower surface from the upper surface. Referring further to FIG. 5, the partition portion INS2_2 may serve to separate the first connection electrode CNE1 and the second connection electrode CNE2, which may be disposed in different subpixels SPXn, from each other. In the process of forming the connection conductive layer, which includes the connection electrodes CNE1 and CNE2 and the conductive patterns CNP1 and CNP2, on the second insulating layer INS2, even though there may be no patterning process of separating the connection electrodes CNE1 and CNE2 disposed between the subpixels SPXn, the second conductive pattern CNP2 and the connection electrodes CNE may be disconnected by the partition portion INS2_2. Accordingly, the first connection electrode CNE1 and the second connection electrode CNE2 between the subpixels SPXn may be separated from each other.

The second insulating layer INS2 may be thicker than a thickness of the insulating layer disposed on a lower or upper portion thereof. For example, a thickness TH3 of the fixing portion INS2_1 may be thicker than a thickness TH1 of the first insulating layer INS1. Thicknesses ('TH21' and 'TH22' of FIG. 5) of the partition portion INS2_2 may be thicker than the thickness TH1 of the first insulating layer INS1. The thickness TH3 of the fixing portion INS2_1 may be equal to or different from the thicknesses TH21 and TH22 of the partition portion INS2_2. In the drawing, the maximum thickness TH21 of the partition portion INS2_2 may be greater than the thickness TH3 of the fixing portion INS2_1, and the minimum thickness TH22 of the partition portion INS2_2 may be smaller than the thickness TH3 of the fixing portion INS2_1. The upper surfaces of the fixing portion INS2_1 and the partition portion INS2_2 may be flat relative to each other.

As the second insulating layer INS2 becomes thicker, it may be possible to separate the conductive patterns CNP1 and CNP2 disposed on the upper surface of the second insulating layer INS2 from the connection electrodes CNE1 and CNE2 disposed in the openings OP1 and OP2. In case that the thickness TH3 of the fixing portion INS2_1 is sufficiently thick, the first conductive pattern CNP1 may be readily separated from the connection electrodes CNE1 and CNE2. In case that the thicknesses TH21 and TH22 of the partition portion INS2_2 are sufficiently thick, the second conductive pattern CNP2 may be readily separated from the connection electrodes CNE1 and CNE2.

Figure 8:
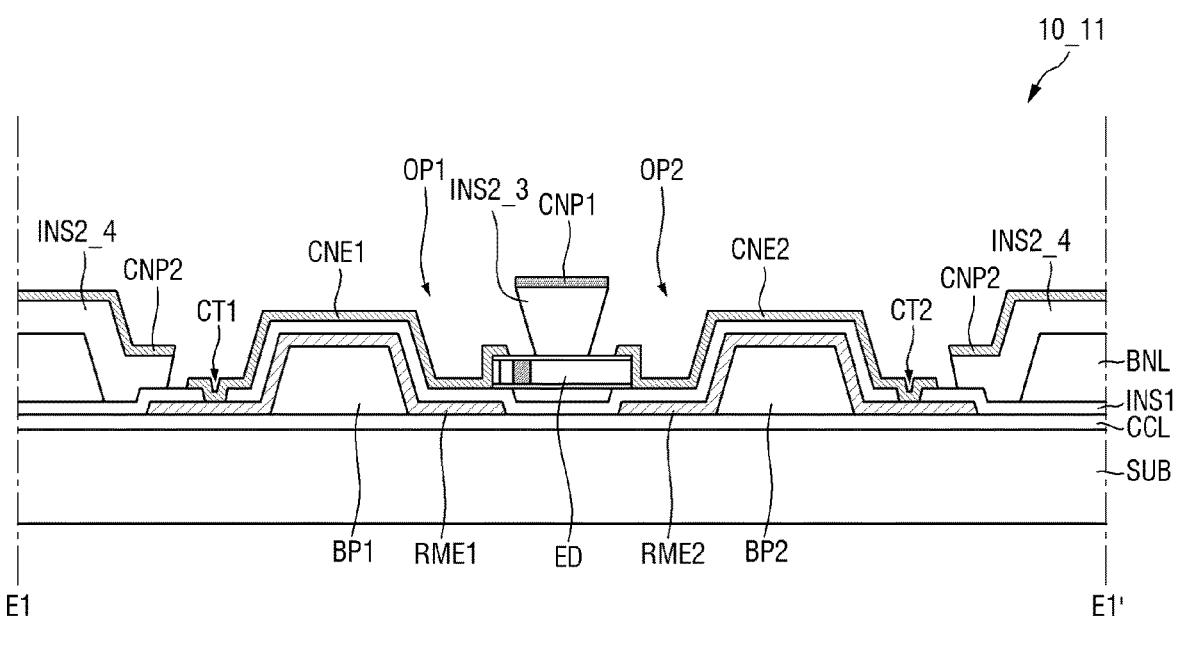
FIG. 8 is a schematic cross-sectional view taken along line E1-E1' of FIGS. 2 and 3 according to another embodiment.
Figure 9:
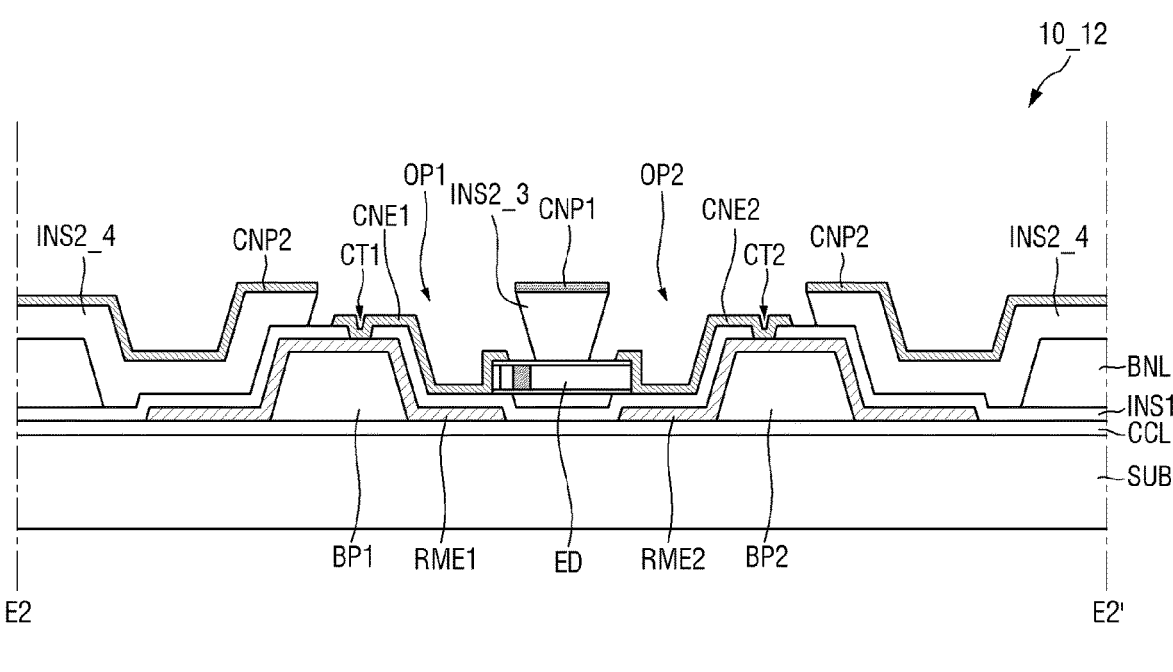
FIG. 9 is another schematic cross-sectional view taken along line E2-E2' of FIGS. 2 and 3 according to another embodiment.

FIG. 8 is a schematic cross-sectional view taken along line E1-E1' of FIGS. 2 and 3 according to another embodiment. FIG. 9 is another schematic cross-sectional view taken along line E2-E2' of FIGS. 2 and 3 according to another embodiment.

Referring to display devices 10_11 and 10_12 of FIGS. 8 and 9, an embodiment may be different from the previous embodiment at least in that a fixing portion INS2_3 and a partition portion INS2_4 of the second insulating layer INS2 may include an inorganic insulating material having a thickness.

In case that the second insulating layer INS2 includes an inorganic insulating material, the upper surface of the second insulating layer INS2 may be partially recessed or protruded to correspond to a step difference therebelow. In case that the second insulating layer INS2 includes an inorganic insulating material, since the possibility of water permeation may be little, the lifetime of the light emitting element ED may be increased.

Even in the case that the fixing portion INS2_3 and the partition portion INS2_4 include an inorganic material, their thicknesses may be thicker than the thickness of the first insulating layer INS1. Therefore, the first conductive pattern CNP1 disposed on the upper portion of the fixing portion INS2_3 and the second conductive pattern CNP2 disposed on the upper portion of the partition portion INS2_4 may be physically spaced apart from the connection electrodes CNE1 and CNE2 disposed in the openings OP1 and OP2.

In an embodiment, the second insulating layer INS2 may be at least one of silicon oxide ($SiO_x$), silicon nitride ($SiN_x$), and silicon oxynitride ($SiO_xN_y$), but is not limited thereto.

In an embodiment, the contact portions CT1 and CT2 of the first insulating layer INS1 may be disposed between the light emitting element ED and the partition portion INS2_4, but may not be disposed between the light emitting element ED and the bank pattern BP1 and BP2. For example, referring to FIG. 8, the contact portions CT1 and CT2 may be disposed to be adjacent to the bank layer BNL and thus disposed between the partition portions INS2_4 and the bank patterns BP1 and BP2. The first contact portion CT1 may be disposed between the partition portion INS2_4 and the first bank pattern BP1, and the second contact portion CT2 may be disposed between the partition portion INS2_4 and the second bank pattern BP2. For another example, referring to FIG. 9, the contact portions CT1 and CT2 may be disposed on the bank patterns BP1 and BP2. The first contact portion CT1 may be disposed on the first bank pattern BP1 adjacent to the partition portion INS2_4, and the second contact portion CT2 may be disposed on the second bank pattern BP2 adjacent to the partition portion INS2_4.

Since the contact portions CT1 and CT2 may be disposed at a position deviating from the light emitting element ED in a horizontal direction (the first direction DR1 or the second direction DR2), a flat structure may be formed between the light emitting element ED and the bank patterns BP1 and BP2. Therefore, diffused reflection may not occur in the middle of an optical path in which light emitted from the light emitting element ED may be moving to the electrodes RME1 and RME2 on the inclined surfaces of the bank patterns BP1 and BP2. The electrodes RME1 and RME2 exposed by the respective contact portions CT1 and CT2 may be in contact with the connection electrode CNE.

The conductive patterns CNP1 and CNP2 disposed on the second insulating layer INS2 may be disposed to correspond to a step difference of the upper surface of the second insulating layer INS2. The first conductive pattern CNP1 may be disposed on the fixing portion INS2_3, and the second conductive pattern CNP2 may be disposed on the partition portion INS2_4. The second conductive pattern CNP2 may have lower and upper surfaces of the same shape as that of the upper surface of the partition portion INS2_4.

Hereinafter, a method of fabricating the display device 10 will be described with reference to other drawings.

FIGS. 10 to 16 are schematic cross-sectional views and schematic plan views per process illustrating a method of fabricating a display device according to an embodiment of the disclosure.

Figure 10:
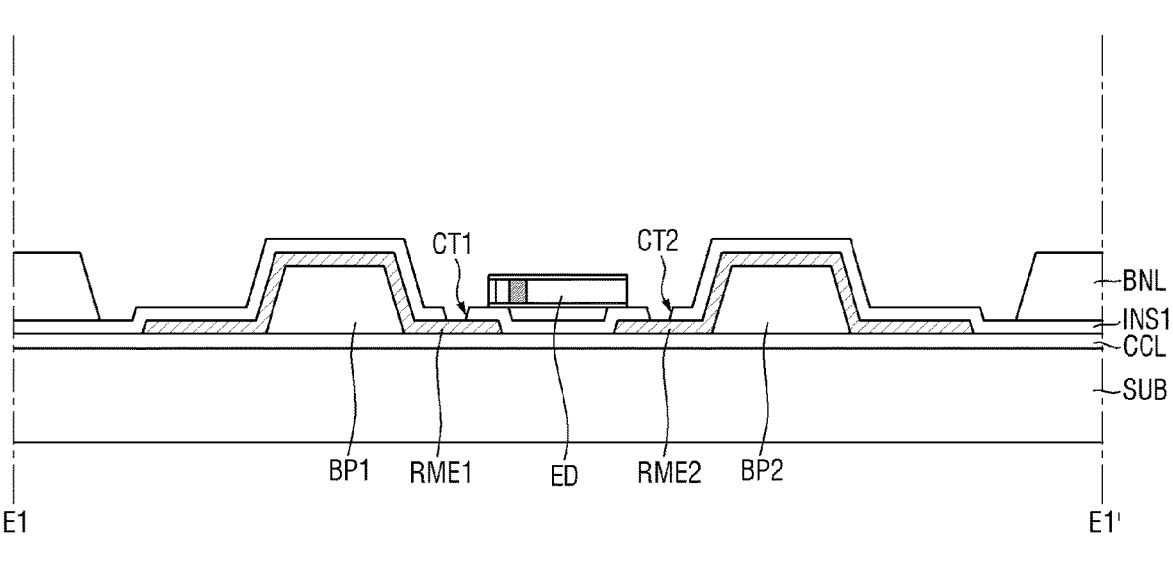
FIGS. 10 to 16 are schematic cross-sectional views and schematic plan views per process illustrating a method of fabricating a display device according to an embodiment of the disclosure.
Figure 10:
Figure 11:
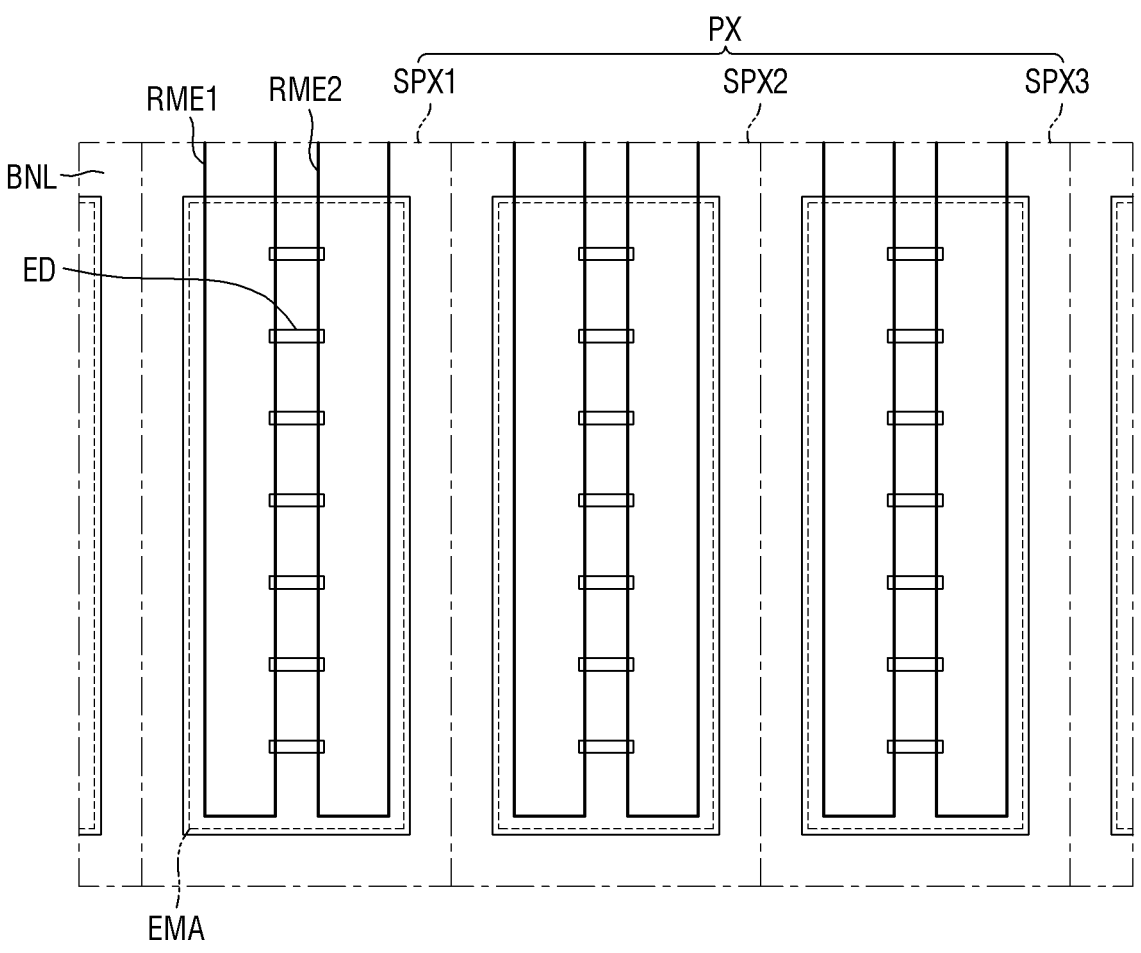
Figure 11:
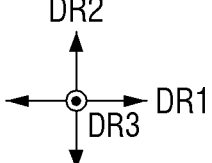

Referring to FIGS. 10 and 11, the first electrode RME1 and the second electrode RME2, which may be spaced apart from each other, may be prepared on the substrate SUB, and the light emitting elements ED may be aligned on the first electrode RME1 and the second electrode RME2.

The light emitting elements ED may be mixed in a solution before they may be aligned, and the solution containing the light emitting elements ED may be ejected onto the first insulating layer INS1 in an inkjet printing manner, but is not limited thereto. The bank layer BNL may serve as a dam that prevents ink from overflowing to the subpixel SPXn adjacent thereto during an inkjet printing process.

An electric field in a specific direction may be formed between the first electrode REM1 and the second electrode RME2, and the light emitting elements ED in the solution may be aligned between the first electrode RME1 and the second electrode RME2.

Figure 12:
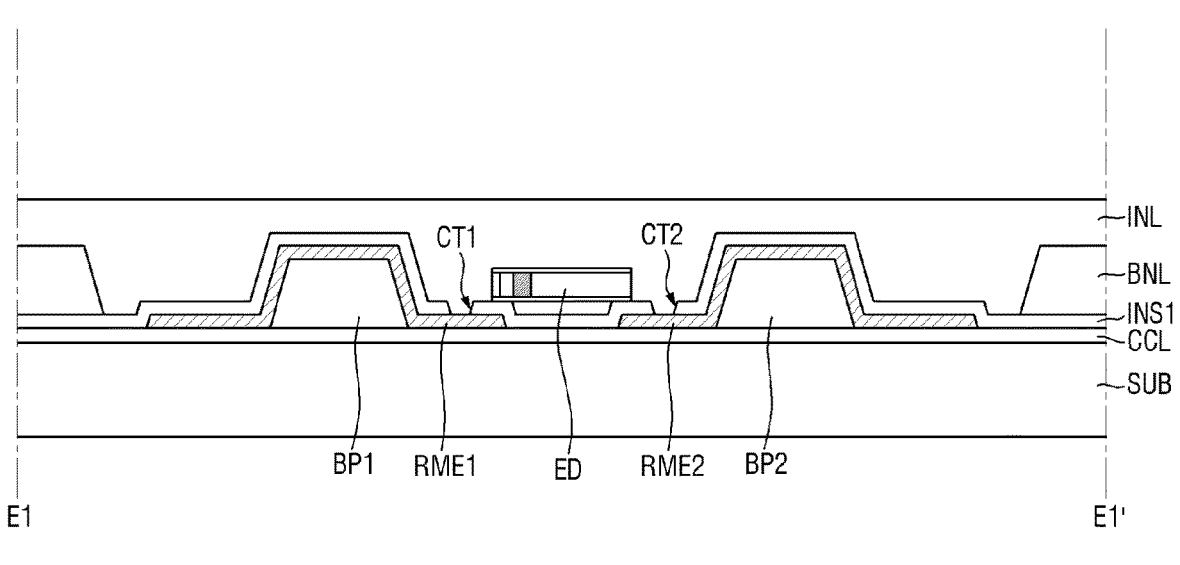
Figure 13:
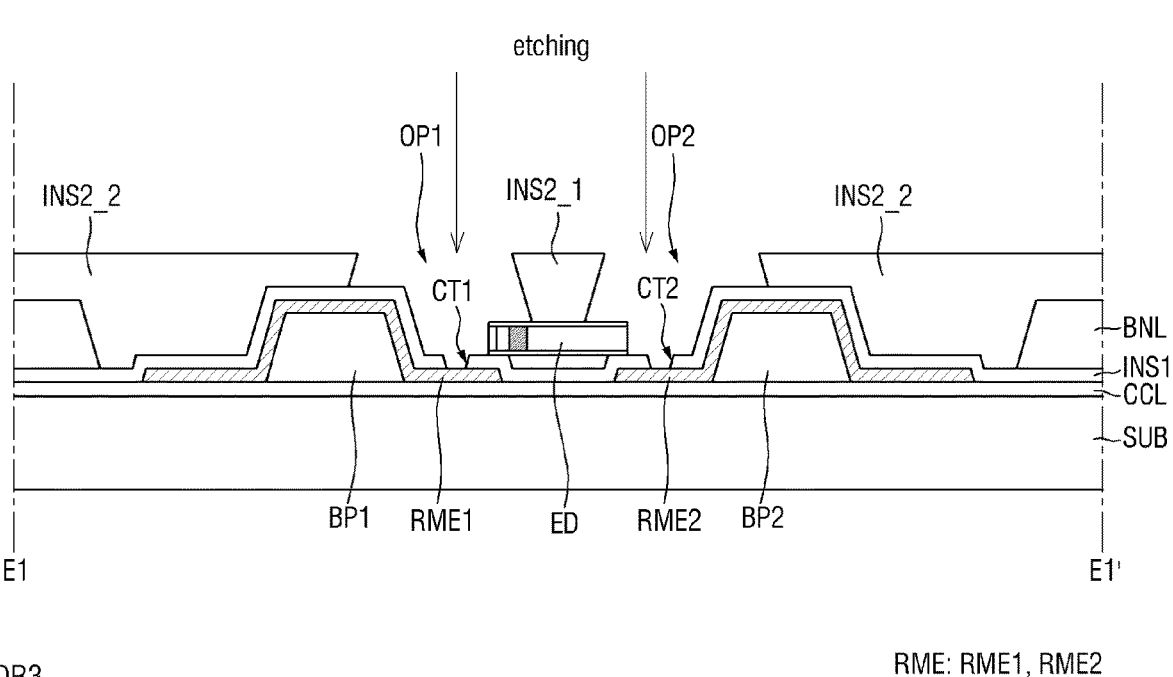
Figure 14:
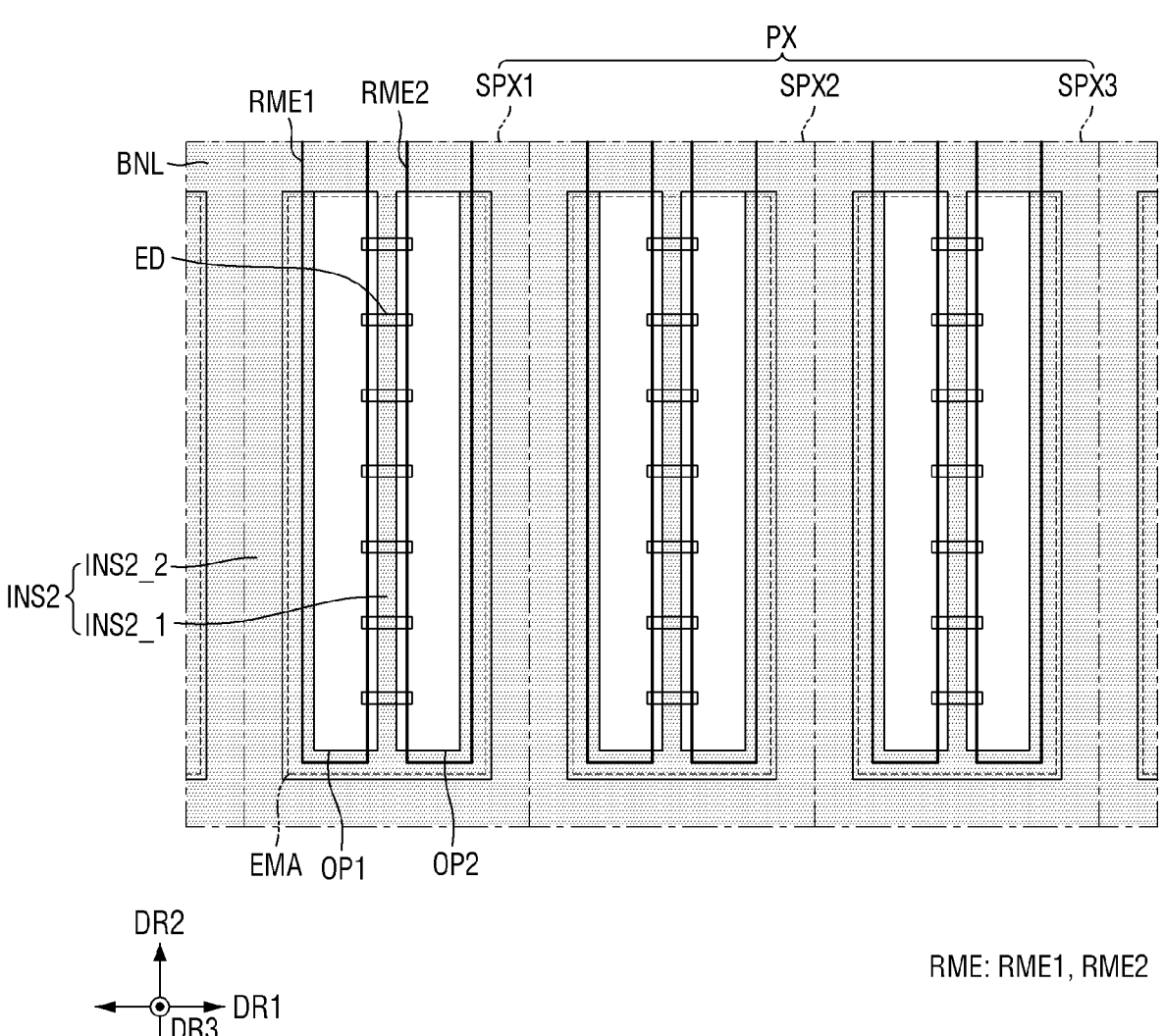

Referring to FIGS. 12 to 14, an insulating material layer INL may be formed on a light emitting element ED, and may be etched to form the fixing portion INS2_1 and the partition portion INS2_2 of the second insulating layer INS2. The insulating material layer INL may include the same material as that of the second insulating layer INS2. Therefore, the first opening OP1 exposing the first end of the light emitting element ED may be formed on the first electrode RME1, and the second opening OP2 exposing the second end of the light emitting element ED may be formed on the second electrode RME2. The first opening OP1 and the second opening OP2 may expose both ends of the light emitting element ED and the first insulating layer INS1, which may be disposed on the electrodes RME1 and RME2, so that both ends of the light emitting element ED may be in contact with the connection electrodes CNE1 and CNE2.

The fixing portion INS2_1, which may be a residue remaining after the insulating material layer INL may be etched, may be formed on a portion of the upper surface of the light emitting element ED, and may overlap the light emitting element ED. The partition portion INS2_2 may be formed to surround the light emitting element ED in the first direction DR1 and the second direction DR2, and may be formed on the first electrode RME1, the second electrode RME2 and the bank layer BNL.

In accordance with an embodiment, the insulating material layers INL may be etched simultaneously or sequentially etched. The insulating material layers INL may be etched through at least one kind of etching process. For example, the insulating material layer INL may be etched through at least one dry and/or wet etching process.

For example, the insulating material layer INL may be over-etched such that its width may be reduced toward the lower surface from the upper surface. As the insulating material layer INL may be over-etched, a portion of the upper surface and the sides of the light emitting element ED, and the first insulating layer INS1 may be partially exposed. As a result, the fixing portion INS2_1 and the partition portion INS2_2, of which widths may be reduced toward the lower surface from the upper surface, may be formed. The process of forming the insulating material layer in the reverse taper shape is not limited to the above example.

Figure 15:
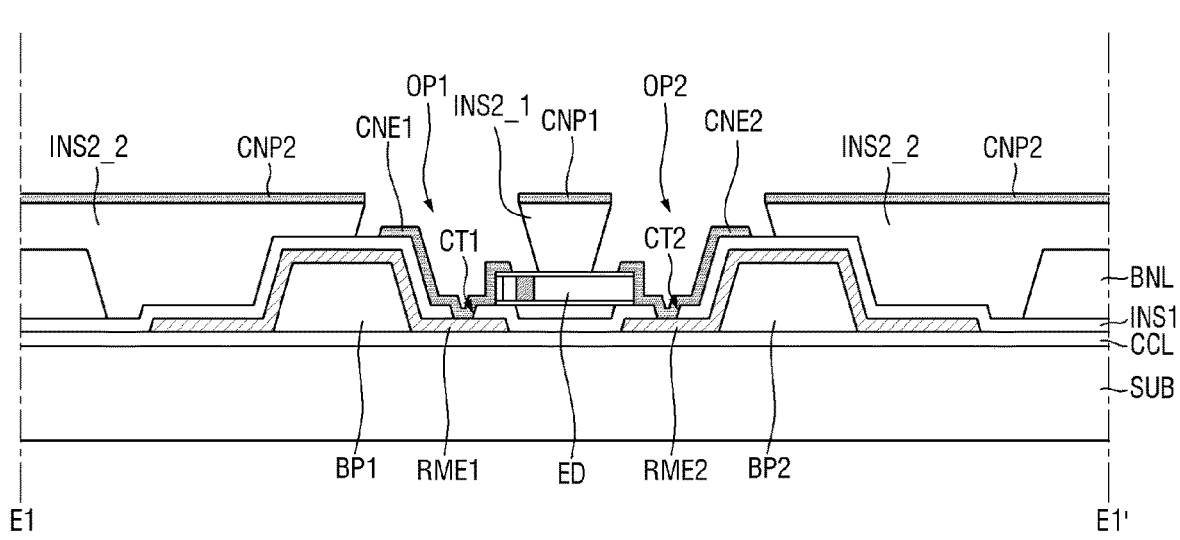
Figure 16:
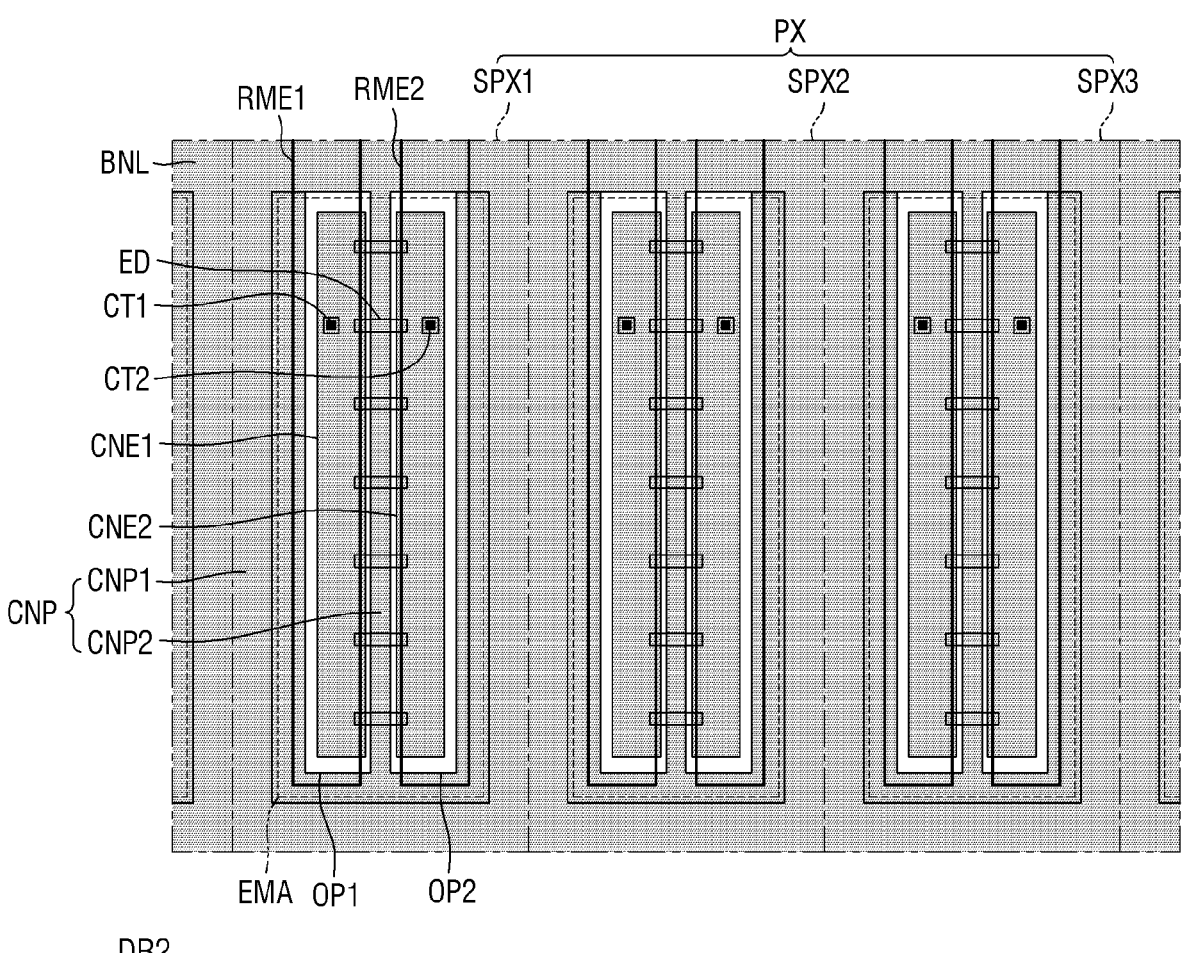

Referring to FIGS. 15 and 16, a connection conductive layer, which includes connection electrodes CNE1 and CNE2 and conductive patterns CNP1 and CNP2, may be formed on the substrate SUB in which the first insulating layer INS1 and the second insulating layer INS2 may be formed. For example, the connection conductive layer may be disposed on the substrate SUB, in which the first insulating layer INS1 and the second insulating layer INS2 may be formed, through various methods such as sputtering, whereby the connection electrodes CNE1 and CNE2 and the conductive patterns CNP1 and CNP2 may be formed. The fixing portion INS2_1 and the partition portion INS2_2 of the second insulating layer INS2 may serve as masks capable of separating each of the connection electrodes CNE1 and CNE2 from the conductive patterns CNP1 and CNP2. The connection electrodes CNE1 and CNE2 may be separated from the conductive patterns CNP1 and CNP2 by the fixing portions INS2_1 and the partition portion INS2_2 of the second insulating layer INS2. The first connection electrode CNE1 may be separated from the second connection electrode CNE2 by the fixing portion INS2_1 of the second insulating layer INS2. In other words, in the process of disposing the connection conductive layer, since the fixing portion INS2_1 and the partition portion INS2_2 may serve as masks for separating the connection conductive layer, a patterning process for separating the connection electrodes CNE1 and CNE2 may be omitted. The fabricating process of the display device 10 may be simplified.

The first connection electrode CNE1 may be in contact with the first end of the light emitting element ED, and may be disposed between the fixing portion INS2_1 and the partition portion INS2_2. The second connection electrode CNE2 may be in contact with the second end of the light emitting element ED, and may be disposed between the fixing portion INS2_1 and the partition portion INS2_2.

Hereinafter, a display device 10_2 according to another embodiment will be described.

Figure 17:
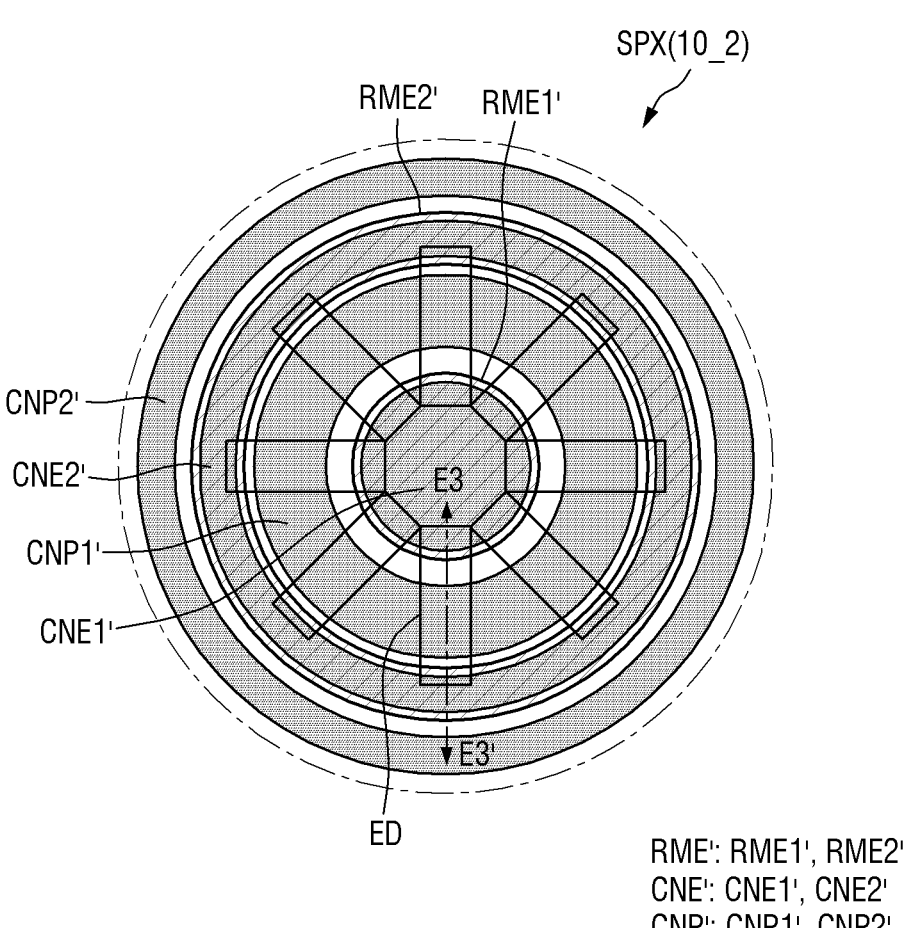
FIG. 17 is a schematic plan view illustrating a pixel of a display device according to another embodiment of the disclosure.
Figure 18:
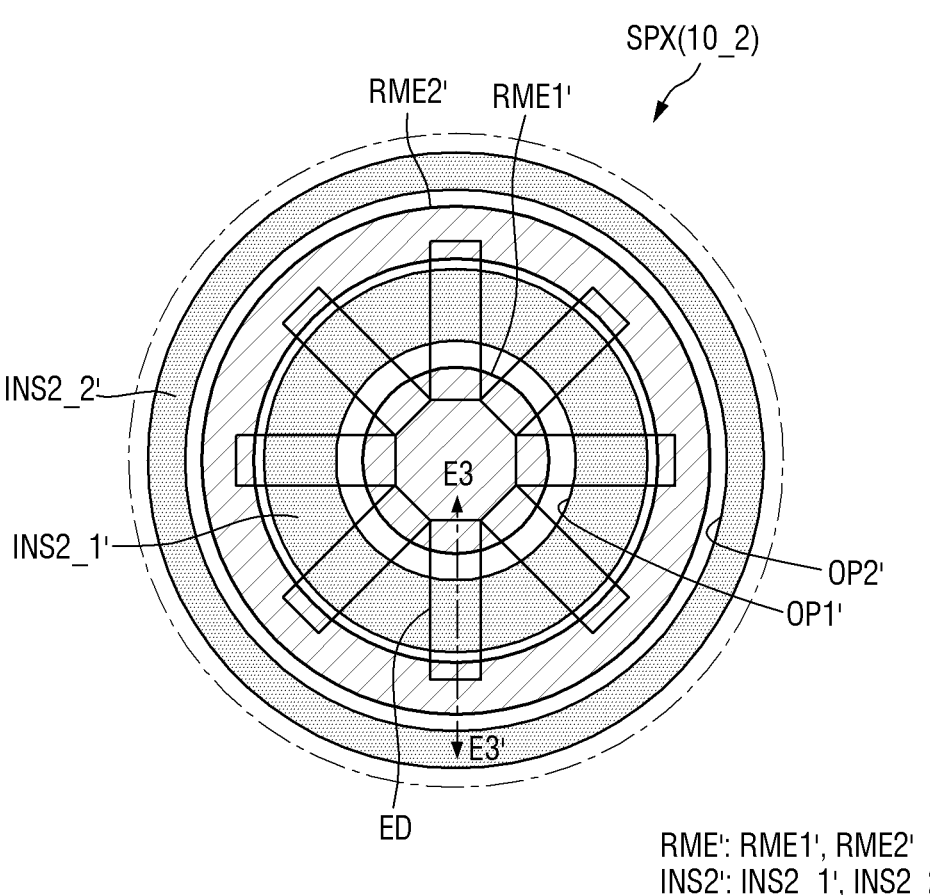
FIG. 18 is a schematic plan view illustrating arrangement of electrodes, light emitting elements and a second insulating layer, which may be disposed in a pixel of FIG. 17.
Figure 19:
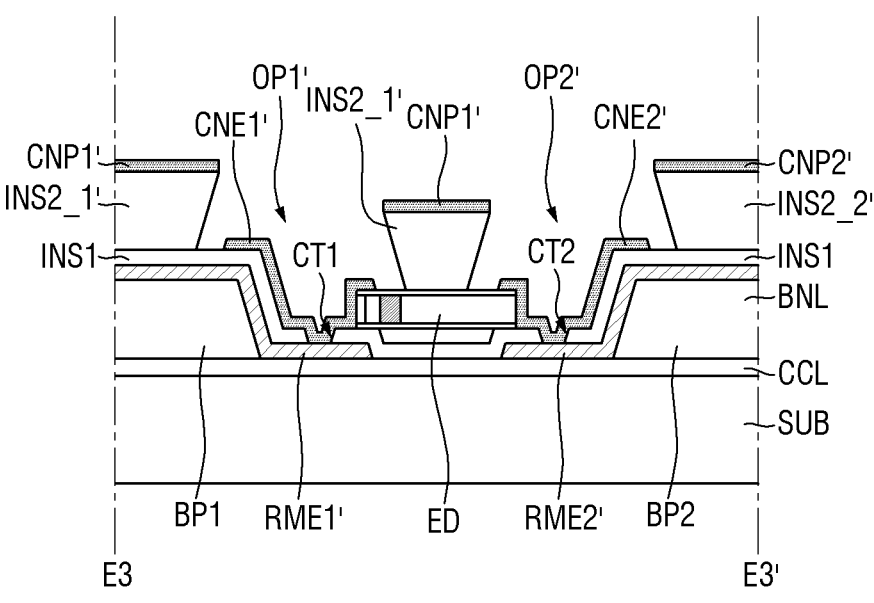
FIG. 19 is a schematic cross-sectional view taken along line E3-E3' of FIGS. 17 and 18.

FIG. 17 is a schematic plan view illustrating a subpixel SPX(10_2) of a display device according to another embodiment. FIG. 18 is a schematic plan view illustrating arrangement of electrodes, light emitting elements and a second insulating layer, which may be disposed in a pixel of FIG. 17. FIG. 19 is a schematic cross-sectional view taken along line E3-E3' of FIGS. 17 and 18.

FIG. 17 shows a plane arrangement of electrodes RME1' and RME2', light emitting elements ED, connection electrodes CNE1' and CNE2', and conductive patterns CNP1' and CNP2', which may be disposed in the first subpixel SPX1 of the display device 10_2. FIG. 18 shows electrodes RME1' and RME2', light emitting elements ED, and a fixing portion INS2_1' and a partition portion INS2_2' of the second insulating layer INS2', which may be disposed in the first subpixel SPX1. The bank layer BNL is not shown in FIGS. 17 and 18, but may be disposed to surround the first subpixel SPX1 in the same manner as in the previous embodiment.

At least a portion of the subpixels SPXn including the first subpixel SPX1 may have a curved shape. For example, the subpixels SPXn may have a circular or oval shape.

The electrodes RME1' and RME2' may have a shape that is at least partially curved within the subpixel SPXn. The electrodes RME1' and RME2' may have a circular or oval shape, or may have a doughnut shape with a hollow interior. The first electrode RME1' may have a circular shape, and the second electrode RME2' may have a doughnut shape having different outer diameters and inner diameters. The second electrode RME2' may be disposed to surround the first electrode RME1'. The outer diameter and the inner diameter of the second electrode RME2' may be greater than a diameter of the first electrode RME1'. An embodiment may be different from the previous embodiment at least in that the electrodes RME' may be electrically connected to the light emitting element ED.

The light emitting elements ED may be disposed between the electrodes RME1' and RME2', and may be spaced apart from each other in a circular shape along the shape of the electrodes RME1' and RME2'. The light emitting elements ED may be extended in the first direction DR1 and the second direction DR2, and may be extended in a diagonal direction inclined with respect to the first direction DR1 and the second direction DR2. Both ends of the light emitting elements ED may be disposed on the different electrodes RME1' and RME2'. For example, the first end of the light emitting elements ED may be disposed on the first electrode RME1', and the second end may be disposed on the second electrode RME2'.

The second insulating layer INS2' may be disposed to surround the subpixels SPXn. The second insulating layer INS2' may have a shape that is at least partially curved. The second insulating layer INS2' may have a doughnut shape with a hollow interior, and its outer diameter may be different from its inner diameter.

The fixing portion INS2_1' of the second insulating layer INS2' may be disposed between the first electrode RME1' and the second electrode RME2', and may be disposed on at least a portion of the light emitting element ED to overlap the light emitting element ED. The fixing portion INS2_1' may have a doughnut shape with a hollow interior. An outer diameter and an inner diameter of the fixing portion INS2_1' may be greater than the diameter of the first electrode RME1', and may be smaller than the inner diameter of the second electrode RME2'. The fixing portion INS2_1' may be disposed in the hollow interior of the second electrode RME2'. The fixing portion INS2_1' may be in the hollow interior of the partition portion INS2_2'.

The partition portion INS2_2' of the second insulating layer INS2' may be disposed to surround the subpixel SPXn. The partition portion INS2_2' may be disposed outside the second electrode RME2'. The partition portion INS2_2' may have a doughnut shape with a hollow interior. An outer diameter and an inner diameter of the partition portion INS2_2' may be greater than the outer diameter of the second electrode RME2'. The partition portion INS2_2' may be disposed at the outermost side of the subpixel SPXn.

Unlike the previous embodiment, the fixing portion INS2_1' and the partition portion INS2_2' may be physically separated from each other. The partition portion INS2_2' may be disposed to surround the fixing portion INS2_1'.

The second insulating layer INS2' may include openings OP1' and OP2' that expose both ends of the light emitting element ED. The openings OP1' and OP2' may be surrounded by the fixing portion INS2_1' and the partition portion INS2_2'. The openings OP1' and OP2' may overlap each of the electrodes RME1' and RME2'. The first opening OP1' may correspond to a hollow inner area of the fixing portion INS2_1'. The first opening OP1' may overlap the first electrode RME1'. A diameter of the first opening OP1' may be equal to the inner diameter of the fixing portion INS2_1'. The second opening OP2' may be disposed between the fixing portion INS2_1' and the partition portion INS2_2'. The second opening OP2' may overlap the second electrode RME2'. The inner diameter of the second opening OP2' may be equal to the outer diameter of the fixing portion INS2_1', and the outer diameter of the second opening OP2' may be equal to the inner diameter of the partition portion INS2_2'.

The connection electrodes CNE1' and CNE2' may be disposed on the electrodes RME1' and RME2' and the second insulating layer INS2'. The connection electrodes CNE' may have a shape substantially similar to that of the openings OP1' and OP2'. The connection electrodes CNE' may be disposed in the openings OP1' and OP2' by using the fixing portion INS2_1' and the partition portion INS2_2' as masks.

The first connection electrode CNE1' may be disposed in the first opening OP1', and may overlap the first electrode RME1' and the first end of the light emitting element ED. The first connection electrode CNE1' may be in contact with the first end of the light emitting element ED. The first connection electrode CNE1' may have a planar circular shape. The center of the first connection electrode CNE1' may be matched with the center of the subpixel SPXn. The first connection electrode CNE1' is illustrated as having a diameter smaller than that of the first electrode RME1', but is not limited thereto.

The second connection electrode CNE2' may be disposed in the second opening OP2', and may overlap the second electrode RME2' and the second end of the light emitting element ED. The second connection electrode CNE2' may be in contact with the second end of the light emitting element ED. The second connection electrode CNE2' may have a doughnut shape with a hollow interior. The second connection electrode CNE2' may completely overlap the second electrode RME2', and may have an outer diameter and an inner diameter, which may be smaller than those of the second electrode RME2', respectively.

The conductive patterns CNP' may be formed simultaneously with the connection electrodes CNE', and may include the same material. The first conductive pattern CNP1' may be disposed on the fixing portion INS2_1' of the second insulating layer INS2', and may overlap a portion of the upper surface of the light emitting element ED. The second conductive pattern CNP2' may be disposed on the partition portion INS2_2' of the second insulating layer INS2'. The conductive patterns CNP' may have a shape substantially the same as that of the lower surface of the second insulating layer INS2' that may be in contact therewith. The conductive patterns CNP' may be positioned in the substantially same position as that of the second insulating layer INS2' that may be in contact therewith.

The center of the first connection electrode CNE1' may be matched with the center of the subpixel SPXn. The diameter of the first connection electrode CNE1' may be smaller than the inner diameter of the first conductive pattern CNP1'. The first conductive pattern CNP1' may be disposed between the first connection electrode CNE1' and the second connection electrode CNE2'. The outer diameter of the first conductive pattern CNP1' may be smaller than the inner diameter of the second connection electrode CNE2'. The second connection electrode CNE2' may be disposed between the first conductive pattern CNP1' and the second conductive pattern CNP2'. The outer diameter of the second connection electrode CNE2' may be smaller than the inner diameter of the second conductive pattern CNP2'. The second conductive pattern CNP2' may be disposed to surround the first connection electrode CNE1', the first conductive pattern CNP1', and the second connection electrode CNE2'. The first connection electrode CNE1', the first conductive pattern CNP1', the second connection electrode CNE2', and the second conductive pattern CNP2' may be sequentially disposed outwardly from the center of the subpixel SPXn.

An embodiment is not limited to the above example, and the planar shapes of the partition portion INS2_2' and the fixing portion INS2_1' may be applied to other shapes such as a square shape, an oval shape, a rectangular shape, or the like.

The fixing portion INS2_1' and the partition portion INS2_2' may have a reverse taper shape. Therefore, in the display device 10_2, the connection electrodes CNE1' and CNE2' may be spaced apart from each other without a patterning process in the process of disposing the connection conductive layer. As a result, the process of the display device 10_2 may be simplified.

Figure 20:
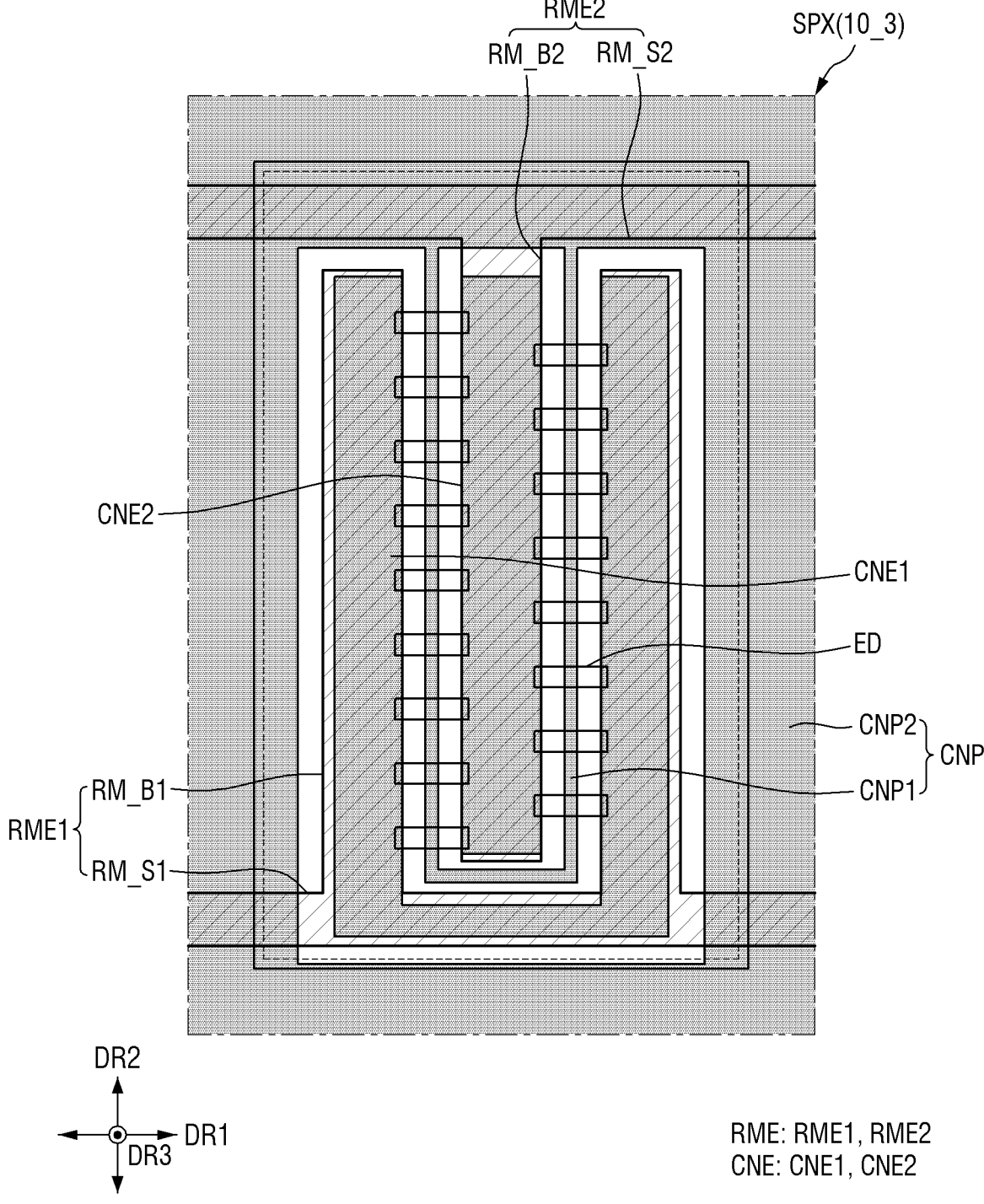
FIG. 20 is a schematic plan view illustrating a pixel of a display device according to another embodiment of the disclosure.
Figure 21:
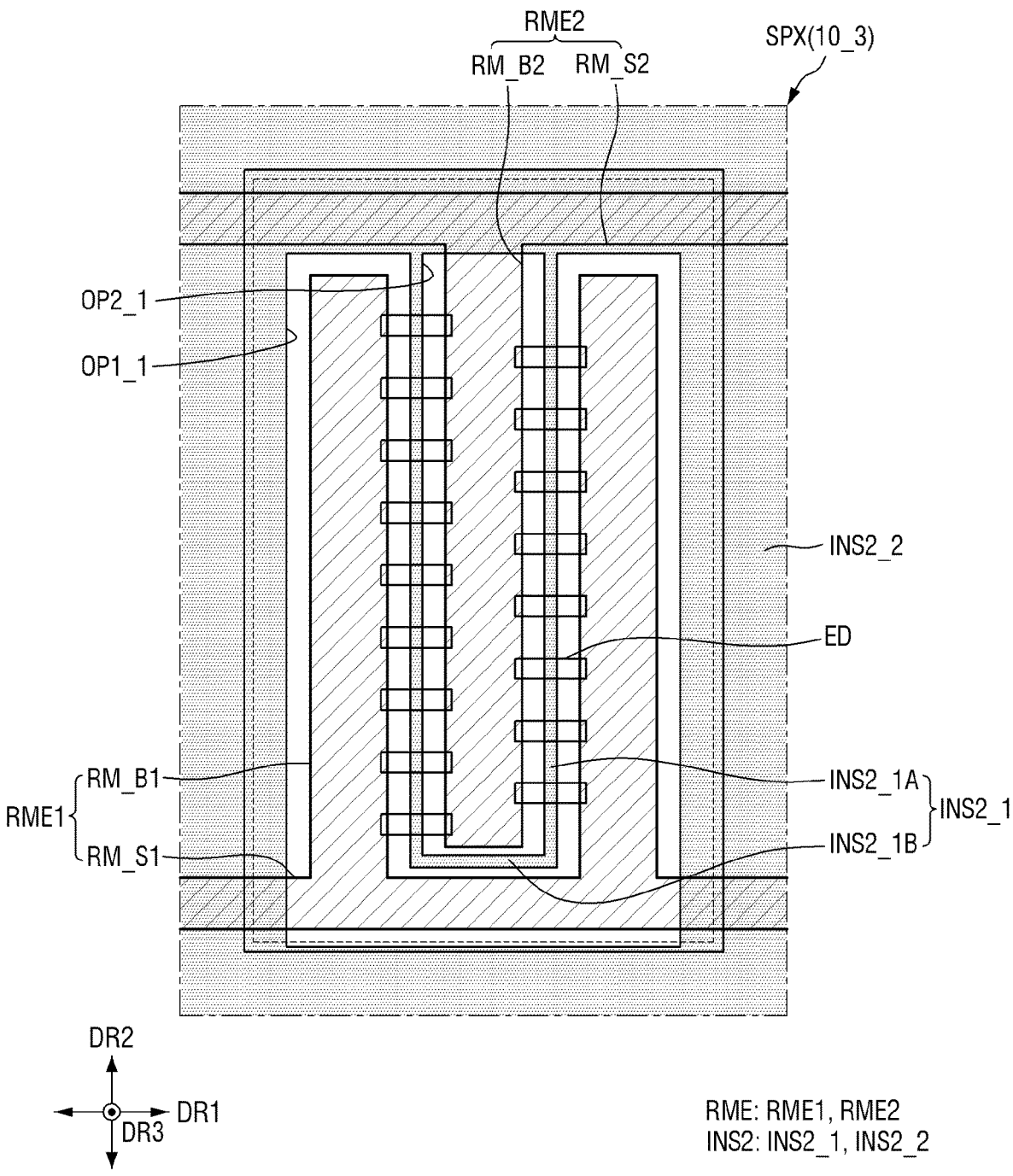
FIG. 21 is a schematic plan view illustrating arrangement of electrodes, light emitting elements, a bank layer and a second insulating layer, which may be disposed in a pixel of FIG. 20.

FIG. 20 is a schematic plan view illustrating a pixel SPX(10_3) of a display device according to another embodiment of the disclosure. FIG. 21 is a schematic plan view illustrating arrangement of electrodes, light emitting elements, a bank layer and a second insulating layer, which may be disposed in a pixel of FIG. 20.

FIG. 20 shows a planar arrangement of the electrodes RME1 and RME2, the light emitting elements ED, connection electrodes CNE1 and CNE2, and the conductive patterns CNP1 and CNP2, which may be disposed in the first subpixel SPX1 of the display device 10_2. FIG. 21 shows the electrodes RME1 and RME2, the light emitting elements ED, and the fixing portion INS2_1 and the partition portion INS2_2 of the second insulating layer INS2, which may be disposed in the first subpixel SPX1.

A display device 10_3 according to an embodiment may be different from that of a previous embodiment at least in that the electrodes RME may have a stem portion and a branch portion. The electrodes RME are illustrated as including a first electrode RME1 including two branch portions RM_B1 connected to a stem portion RM_S1 and a second electrode RME2 including one branch portion RM_B2 connected to a stem portion RM_S2, but are not limited thereto. The first electrode RME1 and the second electrode RME2, which may be disposed in the subpixel SPXn, may include branch portions RM_B1 and RM_B2.

The stem portion RM_S1 of the first electrode RME1 may be extended in the first direction DR1, and the branch portion RM_B1 may be extended in the second direction DR2. The different branch portions RM_B1 may be spaced apart from each other in the first direction DR1. The stem portion RM_S2 of the second electrode RME2 may be extended in the first direction DR1, and the branch portion RM_B2 may be extended in the second direction DR2.

The second insulating layer INS2 may include a fixing portion INS2_1 overlapped with the light emitting element, and a partition portion INS2_2 surrounding the subpixel SPXn and the light emitting elements ED. The fixing portion INS2_1 may include a fixed stem portion INS2_1B and a fixed branch portion INS2_1A, which may be connected to each other. The two-pronged fixed branch portions INS2_1A extended from the fixed stem portion INS2_1B in the second direction DR2 may be disposed on at least a portion of the light emitting element ED.

The partition portion INS2_2 may surround the subpixels SPXn and the light emitting elements ED in the same manner as the previous embodiment. The partition portion INS2_2 may be extended in the first direction DR1 and the second direction DR2. The partition portion INS2_2 and the fixing portion INS2_1 may be integral with each other.

The second insulating layer INS2 may include openings OP1_1 and OP2_1 that may be spaced apart from each other. The first opening OP1_1 may include a stem portion and a branch portion to have a shape similar to that of the first electrode RME1, and the second opening OP2_1 may have a shape similar to that of the second electrode RME2. An embodiment may be the same as the previous embodiment at least in that the openings OP1_1 and OP2_1 may expose both ends of the light emitting element ED.

The connection electrodes CNE1 and CNE2 may be in contact with the light emitting elements ED in the openings OP1_1 to OP2_1. The first connection electrode CNE1 may include a stem portion and a branch portion similarly to the first electrode RME1 and the first opening OP1_1. The second connection electrode CNE2 may be extended in the first direction DR1 similarly to the second electrode RME2 and the second opening OP2_1. The second connection electrode CNE2 may be disposed between the first connection electrodes CNE1.

The conductive patterns CNP1 and CNP2 may be disposed on the second insulating layer INS2, and may have a shape substantially similar to that of the second insulating layer INS2. The first conductive pattern CNP1 may be disposed on the stem portion INS2_1B and the branch portion INS2_1A of the fixing portion INS2_1, and may have a shape similar to those of the stem portion INS2_1B and the branch portion INS2_1A of the fixing portion INS2_1. The second conductive pattern CNP2 may be disposed on the partition portion INS2_2, and may have a shape similar to that of the partition portion INS2_2.

The display device 10_3 according to an embodiment may include a fixing portion INS2_1 and a partition part INS2_2, which may be formed in a reverse taper shape, so that the connection electrodes CNE1 and CNE2 may be spaced apart from each other without a patterning process in the process of disposing the connection conductive layer. Therefore, the process of the display device 10_3 may be simplified.

In concluding the detailed description, those skilled in the art will appreciate that many variations and modifications can be made to the embodiments without substantially departing from the principles of the disclosure. Therefore, the disclosed embodiments are used in a generic and descriptive sense only and not for purposes of limitation.

What is claimed is:

1. A display device comprising:
a first electrode and a second electrode disposed to be spaced apart from each other on a substrate;
a light emitting element disposed between the first electrode and the second electrode, including a first end and a second end;
an insulating layer disposed on the light emitting element, including a fixing portion disposed on at least a portion of the light emitting element and a partition portion surrounding the light emitting element;
a first connection electrode electrically contacting the first end of the light emitting element; and
a second connection electrode electrically contacting the second end of the light emitting element,
wherein a width of an upper surface of each of the fixing portion and the partition portion is greater than a width of a lower surface of each of the fixing portion and the partition portion.

2. The display device of claim 1, wherein each of the fixing portion and the partition portion has an inverse taper shape in which a width from the upper surface to the lower surface is reduced.

3. The display device of claim 1, wherein the first connection electrode and the second connection electrode are spaced apart from each other with the fixing portion interposed therebetween.

4. The display device of claim 1, further comprising:
a conductive pattern disposed on the fixing portion to overlap the light emitting element,
wherein the conductive pattern is spaced apart from the first connection electrode and the second connection electrode.

5. The display device of claim 4, wherein the conductive pattern and the first connection electrode and the second connection electrode include a same material.

6. The display device of claim 1, wherein the insulating layer includes an organic insulating material.

7. The display device of claim 1, further comprising:
a first insulating layer disposed between the first and second electrodes and the light emitting element; and
first and second contact portions exposing upper surfaces of the first and second electrodes by passing through the first insulating layer, wherein
the first electrode and the first connection electrode are electrically connected to each other through the first contact portion, and
the second electrode and the second connection electrode are electrically connected to each other through the second contact portion.

8. The display device of claim 7, wherein a thickness of the first insulating layer is smaller than a thickness of the insulating layer.

9. The display device of claim 1, wherein the insulating layer includes a first opening exposing the first end of the light emitting element, and a second opening exposing the second end of the light emitting element, and
the first connection electrode is disposed in the first opening, and the second connection electrode is disposed in the second opening.

10. The display device of claim 1, wherein the fixing portion and the partition portion are integral with each other, and the fixing portion is disposed across the partition portion.

11. The display device of claim 1, wherein
the fixing portion and the partition portion are physically separated from each other, and
an inner diameter of the partition portion is greater than an outer diameter of the fixing portion.

12. An electronic device comprising:
a first electrode and a second electrode disposed to be spaced apart from each other in a subpixel;
light emitting elements disposed between the first electrode and the second electrode, each including a first end and a second end;
an insulating layer disposed on the light emitting elements, including a fixing portion disposed on at least a portion of the light emitting elements, a partition portion surrounding the subpixel, and openings disposed between the fixing portion and the partition portion;
a first connection electrode electrically contacting the first end of the light emitting elements; and
a second connection electrode electrically contacting the second end of the light emitting elements,
wherein the first connection electrode and the second connection electrode are entirely disposed in the openings.

13. The electronic device of claim 12, wherein
The fixing portion is extended in a second direction intersecting a first direction that is a longitudinal direction of the light emitting element, and
the partition portion is extended in the first direction and the second direction.

14. The electronic device of claim 12, further comprising:

a bank layer extended in a first direction and a second direction intersecting the first direction, surrounding the subpixel, wherein the insulating layer is disposed on the bank layer.

15. The electronic device of claim 14, wherein a width of the partition portion in the first direction is greater than a width of the bank layer in the first direction.

16. The electronic device of claim 12, wherein the opening exposes the first end and the second end of the light emitting element.

17. The electronic device of claim 12, wherein the subpixel includes a first subpixel and a second subpixel adjacent to a direction of the first subpixel, a second connection electrode of the first subpixel and a third connection electrode of the second subpixel are disposed to be spaced apart from each other with the partition portion interposed therebetween.

18. A method of fabricating a display device, the method comprising:

aligning a light emitting element between a first electrode and a second electrode, which are spaced apart from each other, on a substrate;

forming a first opening exposing a first end of the light emitting element and a second opening exposing a second end of the light emitting element by etching an insulating material layer formed on the light emitting element; and forming a first connection electrode, which electrically contacts the first end of the light emitting element, in the first opening and forming a second connection electrode, which electrically contacts the second end of the light emitting element, in the second opening, wherein the etching of the insulating material layer includes forming a fixing portion on at least a portion of the light emitting element and a partition portion surrounding the light emitting element, and each of the fixing portion and the partition portion has a width of an upper surface, which is greater than a width of a lower surface.

19. The method of claim 18, wherein the forming of the first connection electrode and the second connection electrode further includes:

forming a conductive pattern, which is spaced apart from the first connection electrode and the second connection electrode, on the fixing portion and the partition portion.

20. The method of claim 19, wherein the first connection electrode, the second connection electrode, and the conductive pattern are simultaneously formed.

* * * * *